United States Patent [19]
Mori

[11] Patent Number: 5,661,681
[45] Date of Patent: Aug. 26, 1997

[54] SEMICONDUCTOR MEMORY AND METHOD OF WRITING, READING, AND SUSTAINING DATA THEREOF

[75] Inventor: Toshihiko Mori, Kawasaki, Japan

[73] Assignee: Fujitsu Limited, Kawasaki, Japan

[21] Appl. No.: 644,667

[22] Filed: May 6, 1996

[30] Foreign Application Priority Data

May 8, 1995 [JP] Japan .................................. 7-109676

[51] Int. Cl.$^6$ .................................................. G11C 11/40
[52] U.S. Cl. .................................... 365/179; 365/155
[58] Field of Search ........................... 365/179, 155, 365/174, 189.01

[56] References Cited

U.S. PATENT DOCUMENTS

| | | | |
|---|---|---|---|
| 5,311,465 | 5/1994 | Mori et al. | 365/179 |
| 5,388,153 | 2/1995 | Sato et al. | 365/179 |

FOREIGN PATENT DOCUMENTS

| | | |
|---|---|---|
| 5-234361 | 9/1993 | Japan . |
| 5-235291 | 9/1993 | Japan . |

Primary Examiner—David C. Nelms
Assistant Examiner—Vu A. Le
Attorney, Agent, or Firm—Staas & Halsey

[57] ABSTRACT

A semiconductor memory has bit lines, word lines, ground lines, and memory cells. The bit lines intersect the word and ground lines, to form intersections where the memory cells are arranged, respectively. Each of the memory cells consists of a double-emitter resonance-tunnel-hot-electron transistor. This transistor has a collector, a first emitter, and a second emitter. Each base-emitter junction of the transistor has an N-shaped negative differential current-voltage characteristic that shows a relatively small gain up to a peak current and a relatively large gain after a valley current. The transistor has a resonance tunnel barrier and a collector barrier so that most of electrons injected from a first level are reflected by the collector barrier, to provide no collector current, and electrons from a second level or electrons thermally excited pass over the collector barrier, to provide a collector current. The first emitter of each transistor is connected to a corresponding one of the ground lines. The second emitter is connected to a corresponding one of the word lines. The collector is connected to a corresponding one of the bit lines. Each of the memory cells has a small number of elements and needs only a small area.

46 Claims, 37 Drawing Sheets

D1···B-E1 JUNCTION
D2···B-E2 JUNCTION
D3···B-C JUNCTION

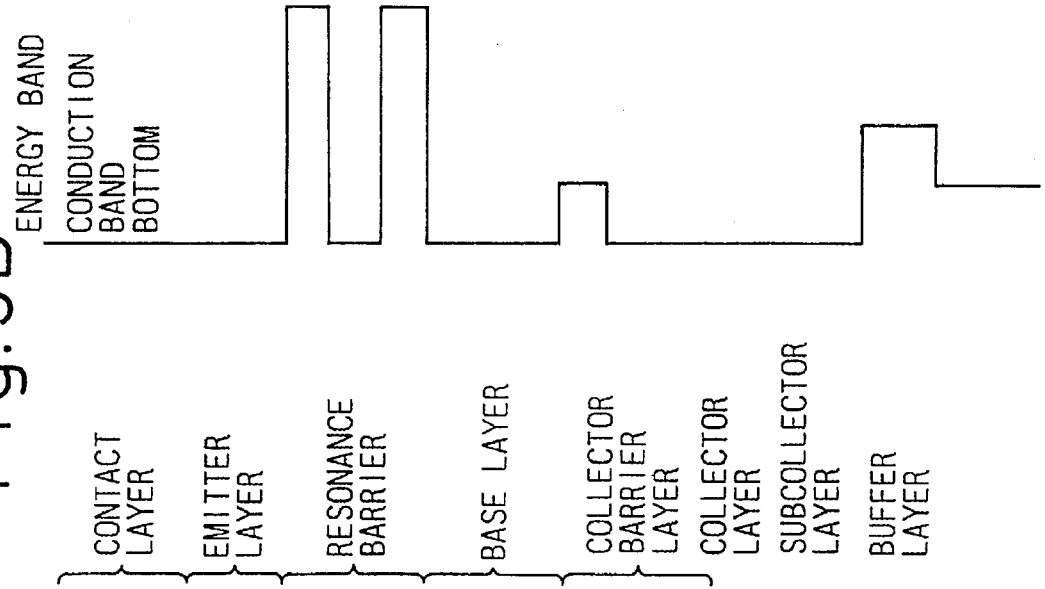

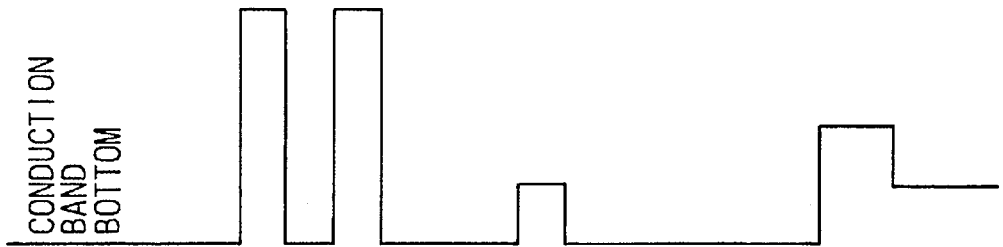
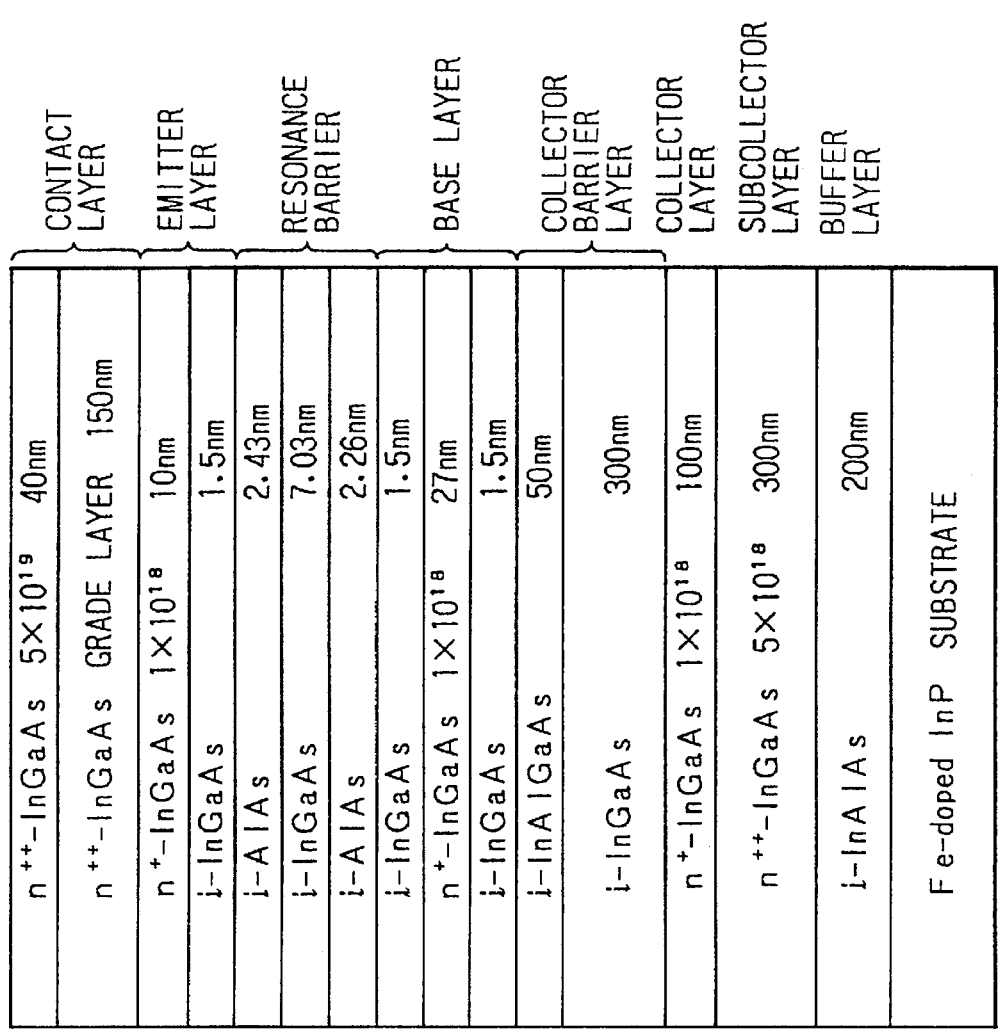

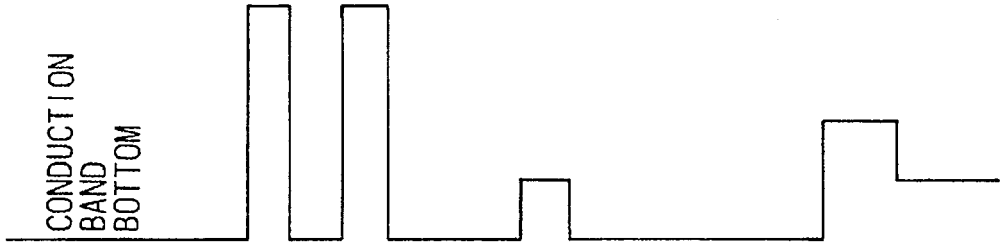

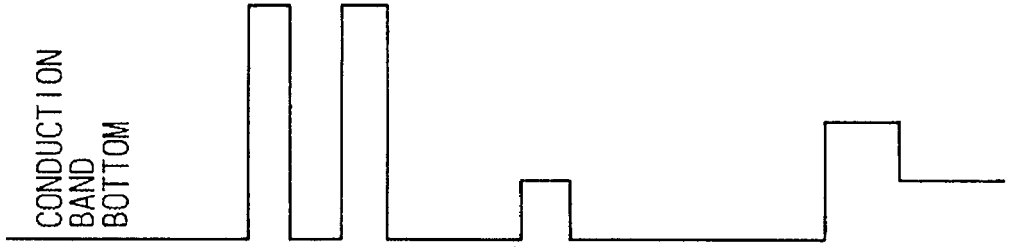

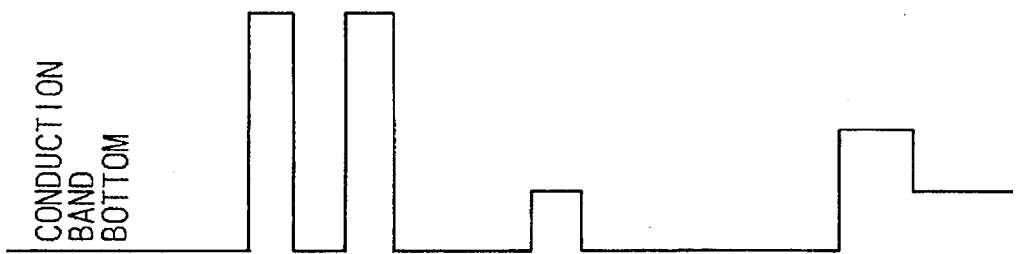

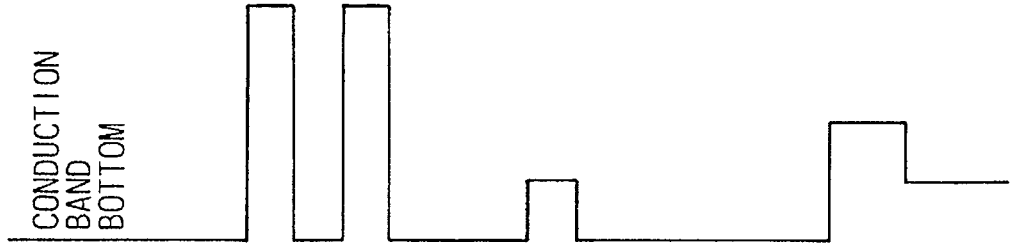

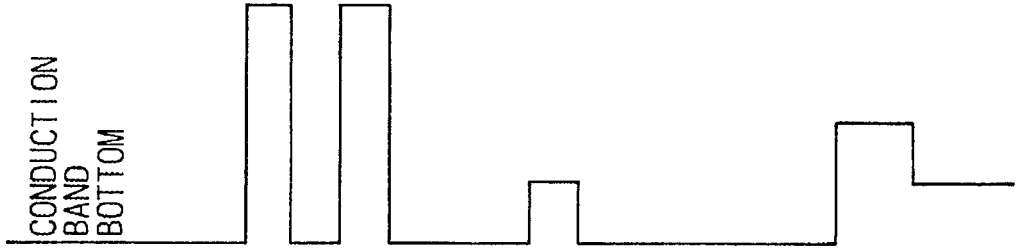
Fig.9A / Fig.9B

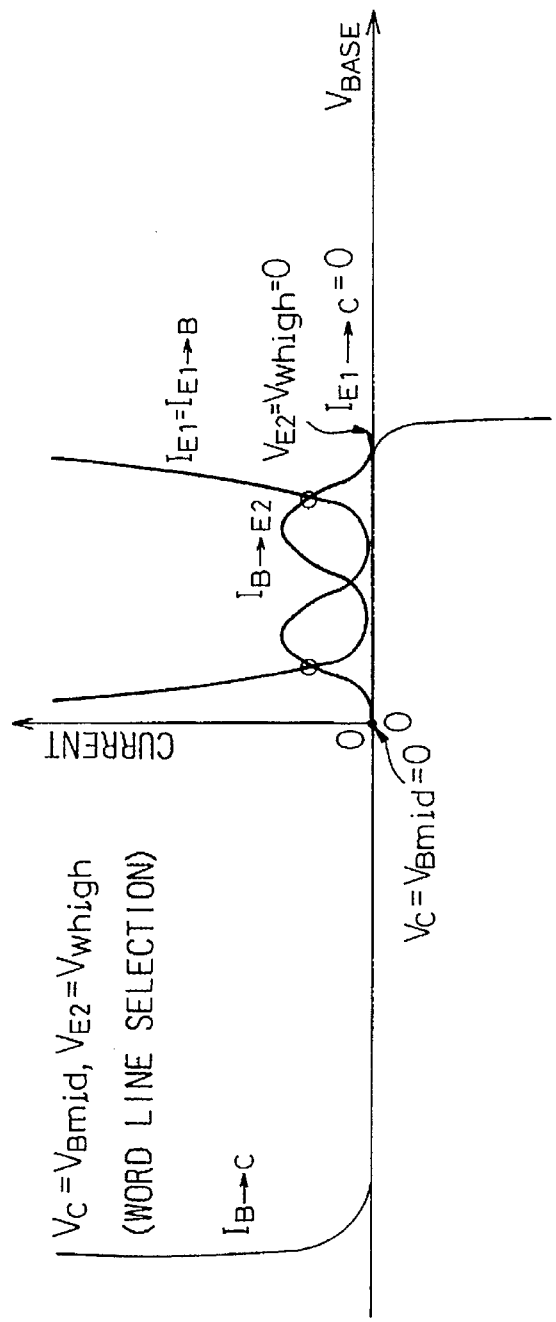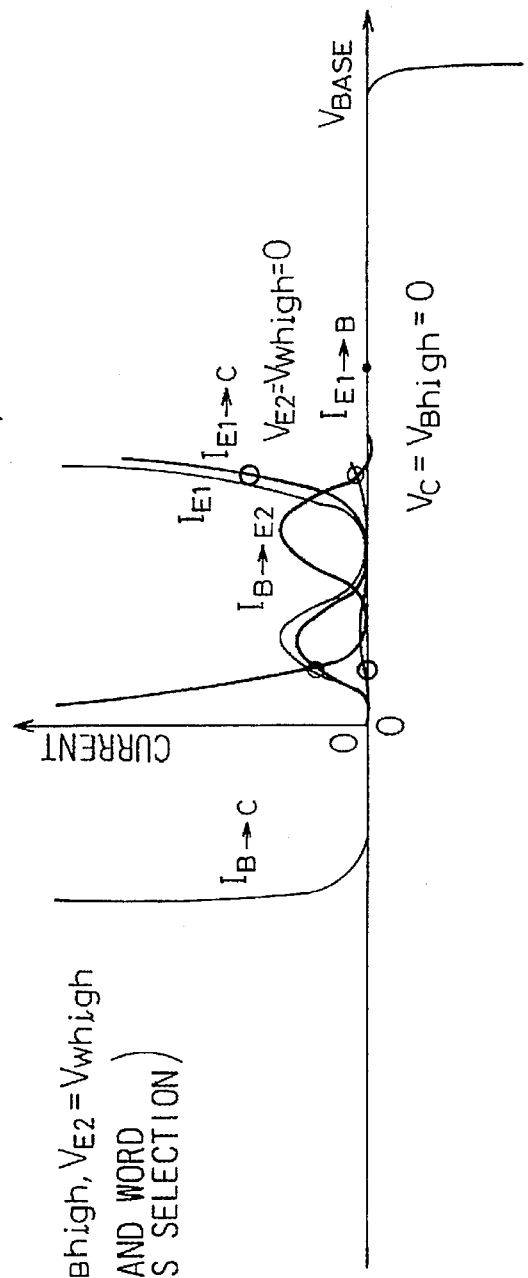

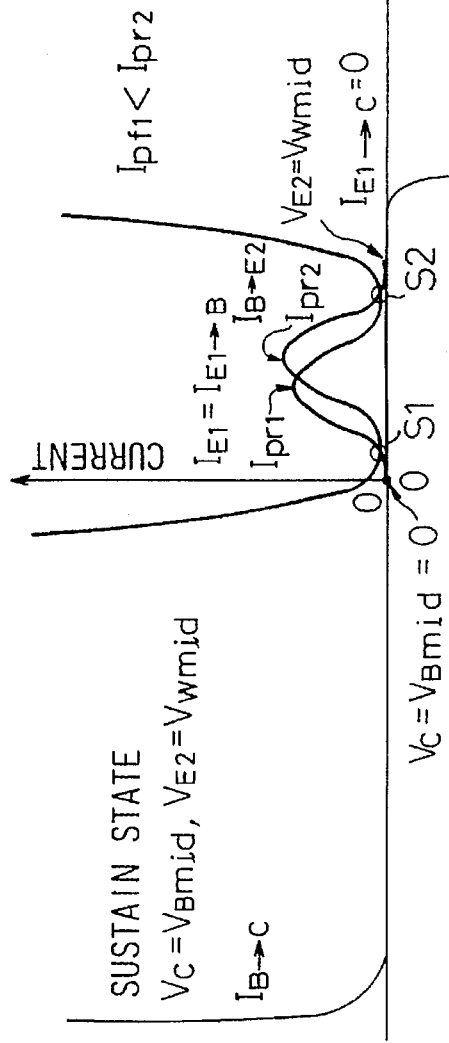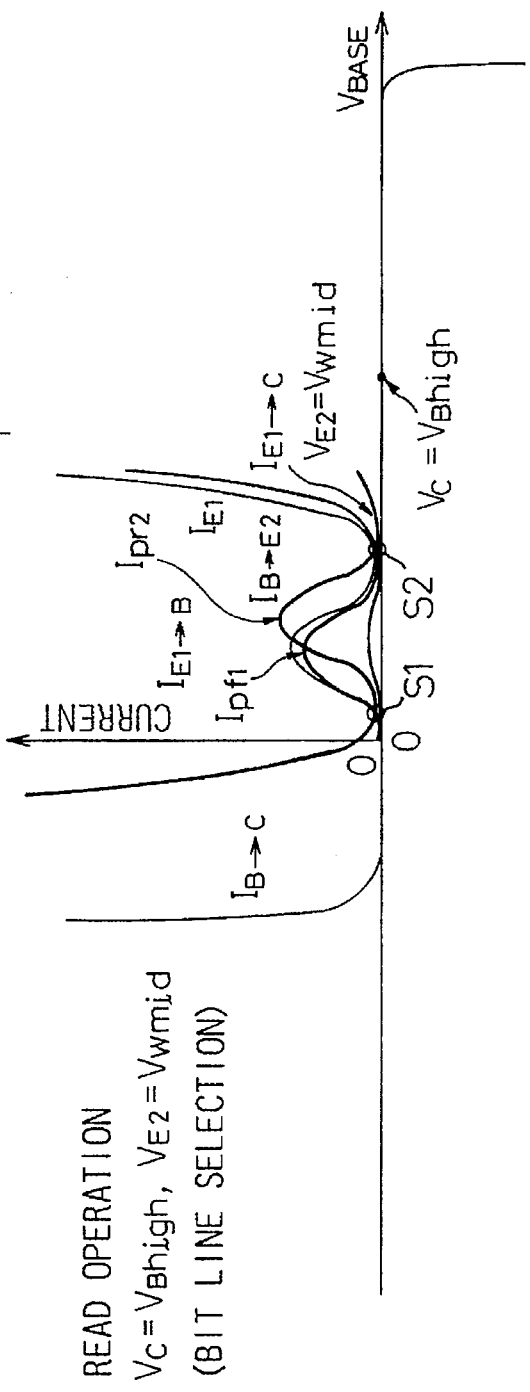
Fig.19
Fig.20A

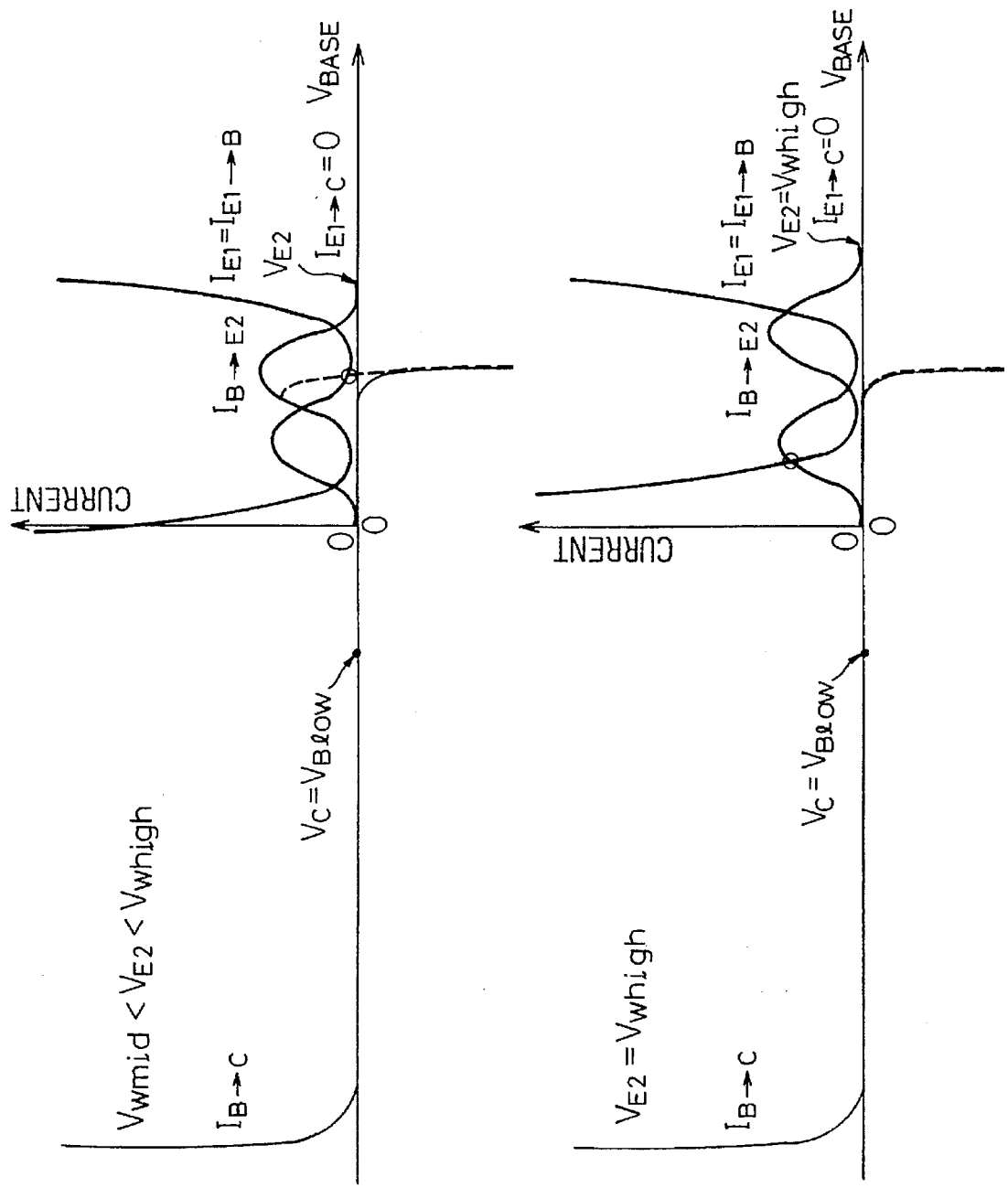

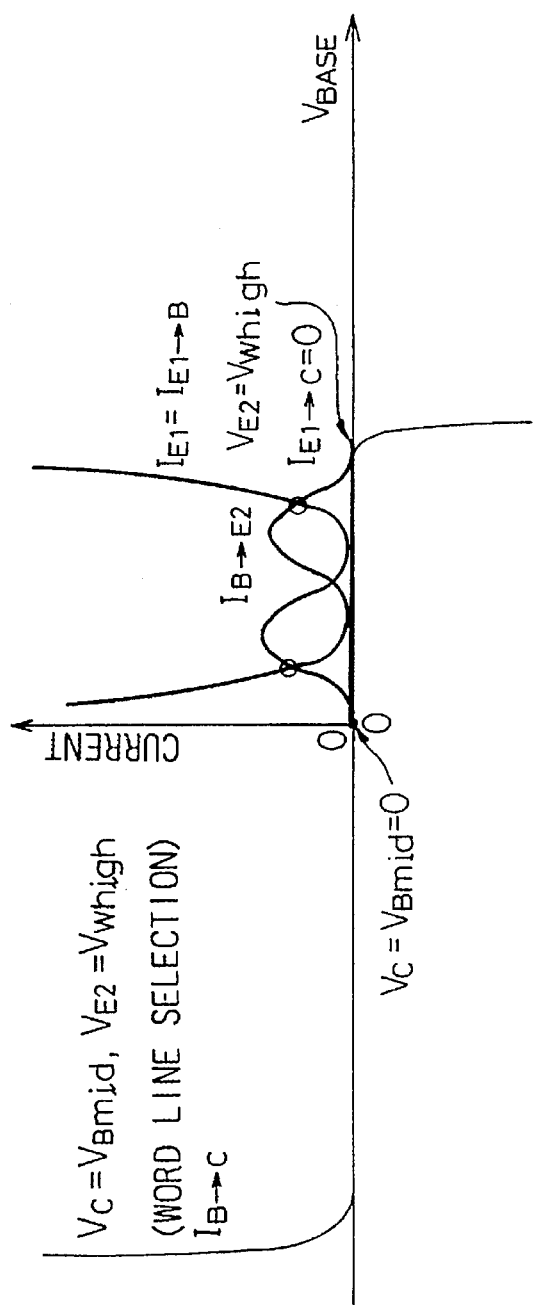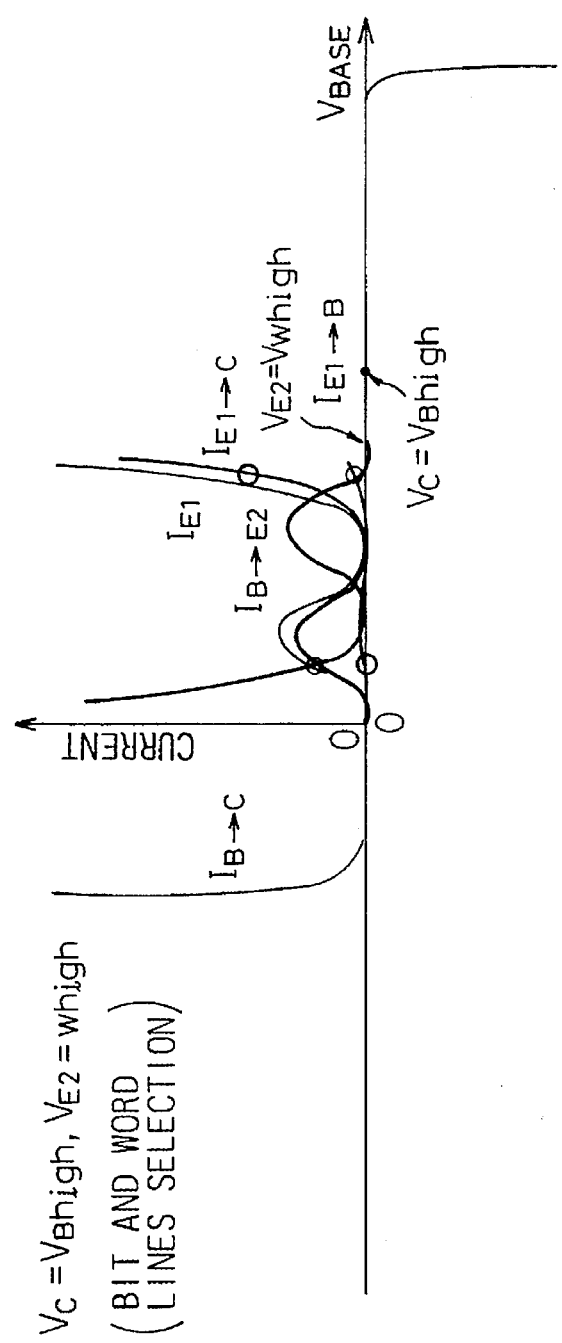

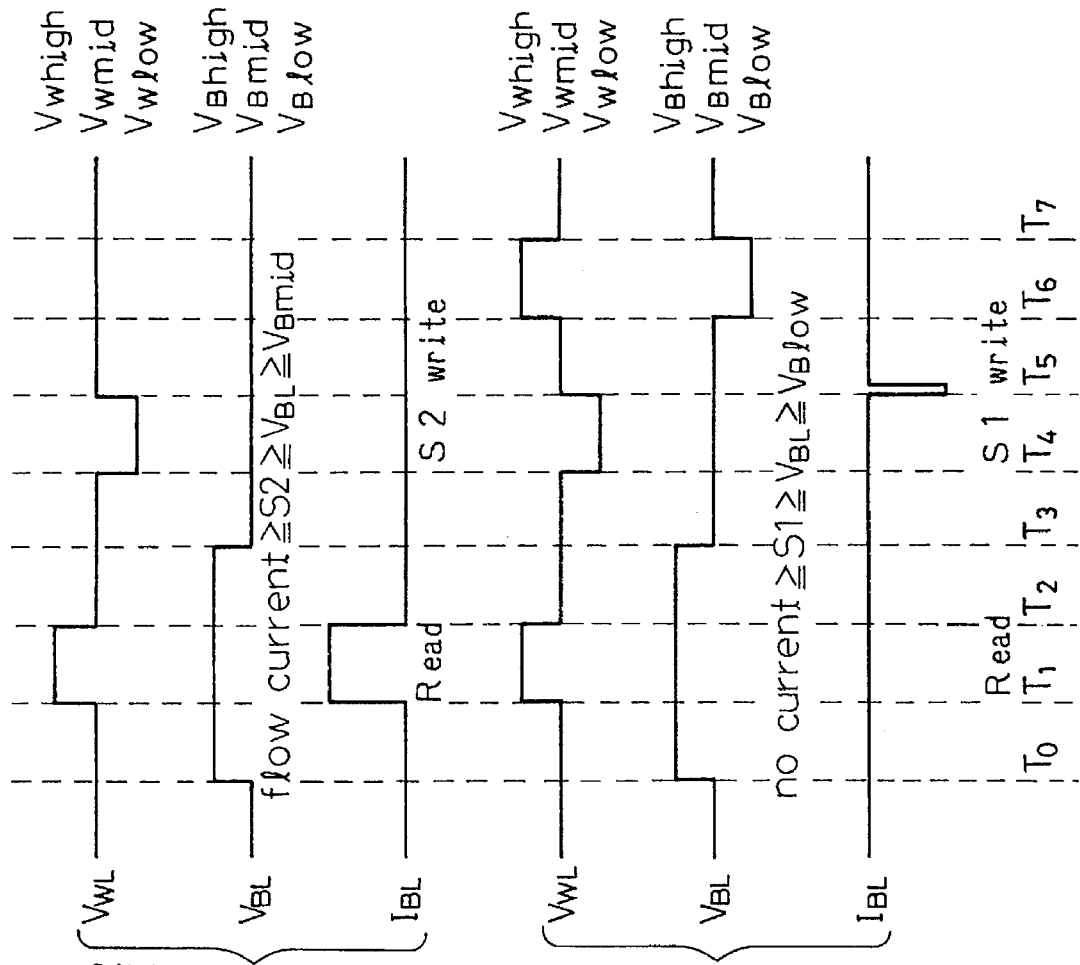

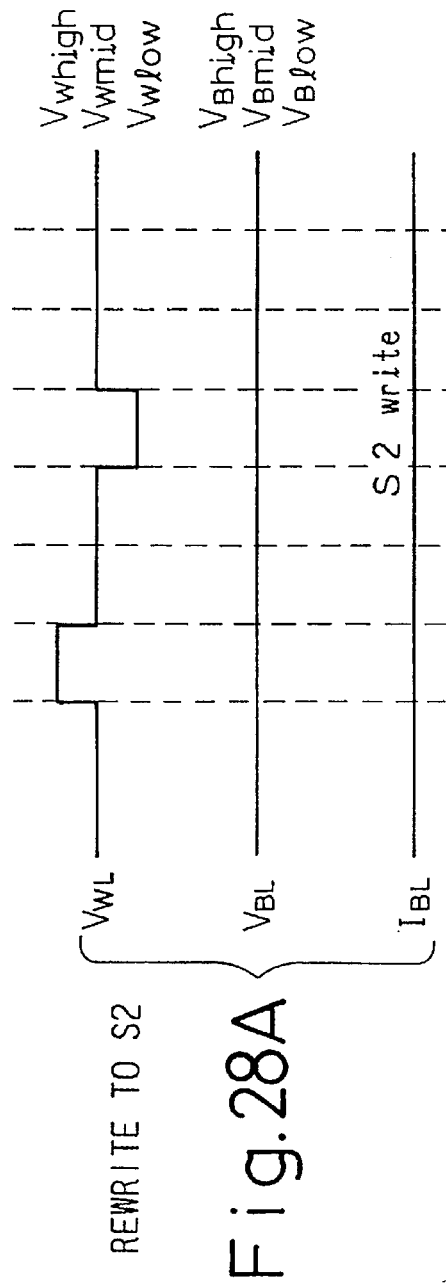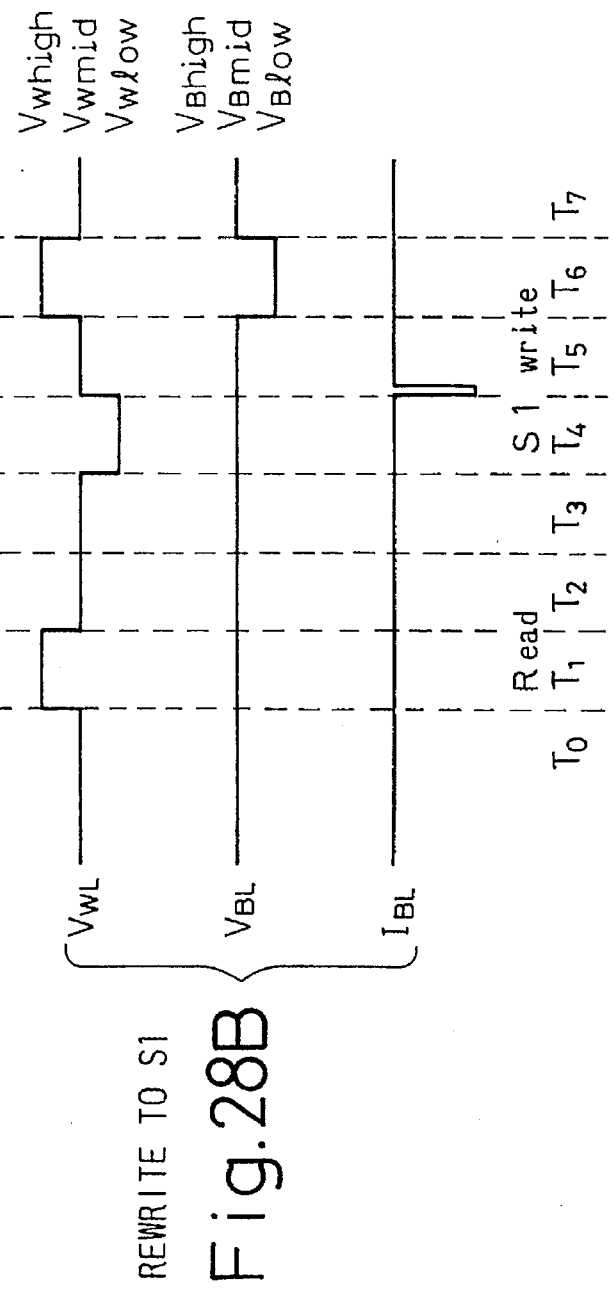

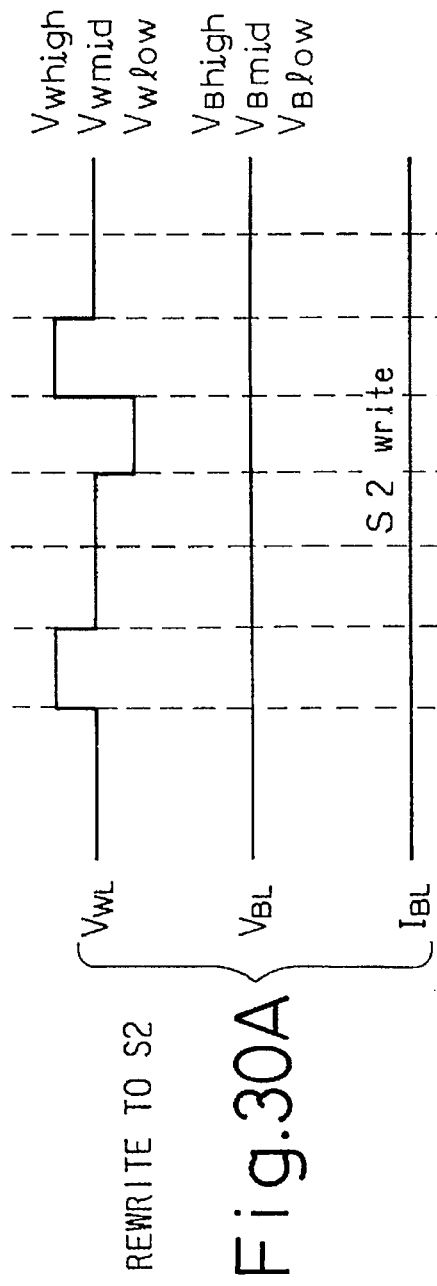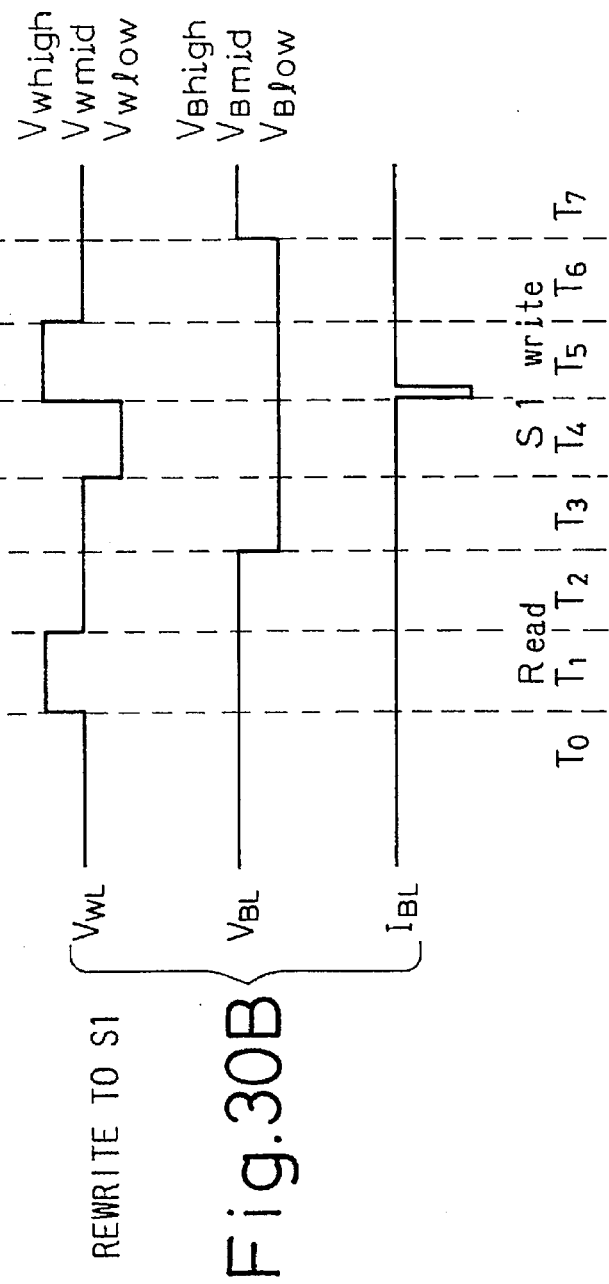
Fig.30A REWRITE TO S2
Fig.30B REWRITE TO S1

SEMICONDUCTOR MEMORY AND METHOD OF WRITING, READING, AND SUSTAINING DATA THEREOF

BACKGROUND OF THE INVENTION

1. Field of the Invention

The present invention relates to a semiconductor memory and a method of writing, reading, and sustaining data thereof, and more particularly, to a semiconductor memory such as an SRAM (static random access memory) having memory cells each made of a resonance-tunnel-hot-electron transistor having a negative differential characteristic and a threshold characteristic and a method of writing, reading, and sustaining data thereof.

2. Description of the Related Art

In recent years, large-scale semiconductor memories such as 256-Mbit DRAMs (dynamic random access memories) and 64-Mbit SRAMs are being developed. Conventional memory cell structures are incapable of realizing higher density memories. Therefore, it is required to provide semiconductor memory cells suitable for forming high-density memories as well as a method of stably driving such memory cells.

Note that each memory cell of a DRAM usually consists of a capacitor for storing data and an FET (field effect transistor) for writing and reading data to and from the capacitor. The capacitor is formed by using the junction capacitance of an FET.

An SRAM employs flip-flop memory cells each consisting of six FETs. This SRAM is hardly minimized because each memory cell needs an area for the six FETs.

Japanese Unexamined Patent Publication Nos. 5-234361 and 5-235291 disclose examples of a semiconductor memory employing memory cells each being small and consisting of a small number of elements, and a method of writing and reading data to and from such memory cells.

These disclosures form each memory cell from a double-emitter transistor, which has two base-emitter junctions each having a negative differential characteristic to provide a bistable state. Data "1" and "0" are allocated to the two stable states, respectively. The bistable state is not broken even when voltages are separately applied to a bit line, word line, and ground line connected to the memory cell. When the memory cell sustains data, no current flows through a base-collector junction having a threshold characteristic.

When given voltages are simultaneously applied to the bit and word (ground) lines of a given memory cell, a current flows through the base-collector junction of the memory cell depending on one of the data storage states, or the data storage states are switched from one to another. Namely, it is possible to write and read data to and from a selected memory cell.

In this way, forming each memory cell with a double-emitter transistor realizes a high-integration SRAM.

To read a memory cell of the SRAM, a current flowing through a corresponding bit line is sensed. This current must be below a peak current to avoid a destructive read operation. Namely, this current determines a memory reading speed. On the other hand, the power consumption of each memory cell is determined by a valley current. Accordingly, the product of speed and power consumption of a memory cell is determined by the peak-valley ratio of a resonance tunnel of the memory cell.

To write data to a memory cell of the SRAM, a potential difference exceeding the forward and reverse breakdown voltages of the memory cell must be applied to the collector and emitters thereof. In this regard, the lower the breakdown voltages, the better. The breakdown voltages, however, must be high when the memory cells are arranged adjacent to one another.

The problem in the prior art will be explained later in detail, with reference to the accompanying drawings.

SUMMARY OF THE INVENTION

An object of the present invention is to provide a semiconductor memory employing memory cells that are small and consist of a small number of elements, and a method of writing, reading, and sustaining data to, from, and at each memory cell of such semiconductor memory.

According to the present invention, there is provided a semiconductor memory having a plurality of bit lines, a plurality of word lines, a plurality of ground lines, and a plurality of memory cells, each of the bit lines intersecting each of the word and the ground lines, to form an intersection where the memory cell is arranged, the memory cell comprising a double-emitter resonance-tunnel-hot-electron transistor having a collector, a first emitter, and a second emitter, each emitter-base junction of the transistor having an N-shaped negative differential current-voltage characteristic that shows a relatively small gain up to a peak current and a relatively large gain after a valley current, the transistor having a resonance tunnel barrier and a collector barrier so that most of electrons injected from a first level are reflected by the collector barrier to produce no collector current, and electrons from a second level or electrons thermally excited pass over the collector barrier to produce a collector current; and the first emitter being connected to the ground line, the second emitter being connected to the word line, and the collector being connected to the bit line.

The negative differential characteristics of the transistor may be designed such that a forward peak current of the first emitter is smaller than a reverse peak current of the second emitter. The area of the emitter-base junction of the first emitter may be smaller than the area of the emitter-base junction of the second emitter.

The negative differential characteristics may be realized by thinning a layer of the resonance tunnel barrier beside the base of the transistor without changing the area thereof. The negative differential characteristics may be realized by lowering a layer of the resonance tunnel barrier beside the base of the transistor without changing the area thereof. The negative differential characteristics may be realized by thickening a spacer of the base beside the resonance tunnel barrier of the transistor without changing the area thereof.

The negative differential characteristics of the transistor may be designed such that a forward peak current is larger than a reverse peak current, and the reverse peak current is larger than the product of the forward peak current and a current gain at a resonance peak with given voltages being applied to the collector and the emitters. The area of the emitter-base junction of the first emitter may be larger than the area of the emitter-base junction of the second emitter.

The negative differential characteristics may be realized by thickening a layer of the resonance tunnel barrier beside the base of the transistor without changing the area thereof. The negative differential characteristics may be realized by heightening a layer of the resonance tunnel barrier beside the base of the transistor without changing the area thereof. The negative differential characteristics may be realized by thinning a spacer of the base beside the resonance tunnel barrier of the transistor without changing the area thereof.

The memory cell may be arranged between the intersections of the bit line, the word line, and the ground line with the word line and the ground line being in parallel with each other and orthogonal to the bit line.

The semiconductor memory may have the bit lines, the word lines, the ground lines, and the memory cells, the bit lines intersecting the word lines and the ground lines, to form intersections where the memory cells are arranged, respectively, wherein the semiconductor memory may further comprise a bit line address decoder for supplying an address signal to the bit lines; a word line address decoder for supplying an address signal to the word lines; and a sense circuit for detecting data stored in the memory cells through the bit lines.

The word lines and the ground lines may be alternated one by one, and the word lines and the ground lines may be alternated two by two. Further, every two adjacent ground lines may be integrated into one.

Further, according to the present invention, there is provided a method of sustaining data of a memory cell of a semiconductor memory, the semiconductor memory having a plurality of bit lines, a plurality of word lines, a plurality of ground lines, and a plurality of memory cells, each of the bit lines intersecting each of the word and the ground lines, to form an intersection where the memory cell is arranged, and the memory cell comprises a double-emitter resonance-tunnel-hot-electron transistor having a collector, a first emitter, and a second emitter, each emitter-base junction of the transistor having an N-shaped negative differential current-voltage characteristic that shows a relatively small gain up to a peak current and a relatively large gain after a valley current, the transistor having a resonance tunnel barrier and a collector barrier so that most of electrons injected from a first level are reflected by the collector barrier to produce no collector current, and electrons from a second level or electrons thermally excited pass over the collector barrier to produce a collector current; and the first emitter being connected to the ground line, the second emitter being connected to the word line, and the collector being connected to the bit line, the memory cell having the first and second base-emitter junctions that form, with the base layer, series circuits to provide two stable operation points, wherein the method comprises the steps of applying a potential, which biases the transistor to the valleys of the N-shaped negative differential characteristics, to one of the first and second emitters; and applying a potential to the bit line, the potential being sufficiently low so as not to provide a gain with respect to a ground level and higher than a reverse breakdown voltage of the base-collector junction of the transistor.

The potential applied to the bit line may be at a ground level.

According to the present invention, there is also provided a method of reading data out of a memory cell of a semiconductor memory, the semiconductor memory having a plurality of bit lines, a plurality of word lines, a plurality of ground lines, and a plurality of memory cells, each of the bit lines intersecting each of the word and the ground lines, to form an intersection where the memory cell is arranged, and the memory cell comprises a double-emitter resonance-tunnel-hot-electron transistor having a collector, a first emitter, and a second emitter, each emitter-base junction of the transistor having an N-shaped negative differential current-voltage characteristic that shows a relatively small gain up to a peak current and a relatively large gain after a valley current, the transistor having a resonance tunnel barrier and a collector barrier so that most of electrons injected from a first level are reflected by the collector barrier to produce no collector current, and electrons from a second level or electrons thermally excited pass over the collector barrier to produce a collector current; and the first emitter being connected to the ground line, the second emitter being connected to the word line, and the collector being connected to the bit line, the memory cell having the first and second base-emitter junctions that form, with the base layer, series circuits to provide the two stable operation points, wherein the method comprises the steps of applying a potential to the bit line so that the transistor of the memory cell provides a sufficient gain, and the first stable operation point involving a low base potential provides a low gain and the second stable operation point involving a high base potential provides a high gain; and applying a potential to the word line, the potential being higher than a sustain potential and sufficiently low so as not to destruct the data stored in the memory cell, and detecting a current passing through the bit line, to read the data.

In addition, according to the present invention, there is provided a method of writing data to a memory cell of a semiconductor memory, the semiconductor memory having a plurality of bit lines, a plurality of word lines, a plurality of ground lines, and a plurality of memory cells, each of the bit lines intersecting each of the word and the ground lines, to form an intersection where the memory cell is arranged, and the memory cell comprises a double-emitter resonance-tunnel-hot-electron transistor having a collector, a first emitter, and a second emitter, each emitter-base junction of the transistor having an N-shaped negative differential current-voltage characteristic that shows a relatively small gain up to a peak current and a relatively large gain after a valley current, the transistor having a resonance tunnel barrier and a collector barrier so that most of electrons injected from a first level are reflected by the collector barrier to produce no collector current, electrons from a second level or electrons thermally excited pass over the collector barrier to produce a collector current, and the negative differential characteristics of the transistor being designed such that a forward peak current of the first emitter is smaller than a reverse peak current of the second emitter; and the first emitter being connected to the ground line, the second emitter being connected to the word line, and the collector being connected to the bit line, the memory cell having the first and second base-emitter junctions that form, with the base layer, series circuits to provide the two stable operation points involving low and high base potentials, respectively, wherein the method comprises the steps of applying a potential, which is lower than a sustain potential, to the memory cell, applying a potential to the word line, to destruct the two stable operation points, and again applying the sustain potential to the word line, to thereby write data to the stable operation point of the memory cell when the data must be written to the operation point; and maintaining the sustain potential applied to the bit line of the memory cell, applying a potential to the word line, to destruct the two stable operation points, and again applying the sustain potential to the word line, to thereby write data to the second stable operation point of the memory cell when the data must be written to the operation point.

According to the present invention, there is provided a method of writing data to an array of memory cells of a semiconductor memory, the semiconductor memory having a plurality of bit lines, a plurality of word lines, a plurality of ground lines, and a plurality of memory cells, each of the bit lines intersecting each of the word and the ground lines, to form an intersection where the memory cell is arranged, and the memory cell comprises a double-emitter resonance-tunnel-hot-electron transistor having a collector, a first emitter, and a second emitter, each emitter-base junction of the transistor having an N-shaped negative differential current-voltage characteristic that shows a relatively small gain up to a peak current and a relatively large gain after a valley current, the transistor having a resonance tunnel barrier and a collector barrier so that most of electrons injected from a first level are reflected by the collector barrier to produce no collector current, electrons from a second level or electrons thermally excited pass over the collector barrier to produce a collector current, and the negative differential characteristics of the transistor being designed such that a forward peak current of the first emitter is smaller than a reverse peak current of the second emitter; and the first emitter being connected to the ground line, the second emitter being connected to the word line, and the collector being connected to the bit line, each memory cell having the first and second base-emitter junctions that form, with the base layer, series circuits to provide the two stable operation points involving low and high base potentials, respectively, wherein the method comprises the steps of maintaining a sustain potential applied to the bit line, applying a potential to a given word line to destruct the two stable operation points of each memory cell connected to the word line, applying a sustain potential to the word line, to thereby write data to the stable operation point of each memory cell connected to the word line; applying a potential, which is lower than the sustain potential, to bit lines connected to memory cells to which data has been written at the second operation point and to which data must be written at the first operation point; and applying a potential to the given word line to destruct the two stable operation points and applying the sustain potential to the word line, to write the data to the memory cells.

Further, according to the present invention, there is provided a method of writing data to a memory cell of a semiconductor memory, the semiconductor memory having a plurality of bit lines, a plurality of word lines, a plurality of ground lines, and a plurality of memory cells, each of the bit lines intersecting each of the word and the ground lines, to form an intersection where the memory cell is arranged, and the memory cell comprises a double-emitter resonance-tunnel-hot-electron transistor having a collector, a first emitter, and a second emitter, each emitter-base junction of the transistor having an N-shaped negative differential current-voltage characteristic that shows a relatively small gain up to a peak current and a relatively large gain after a valley current, the transistor having a resonance tunnel barrier and a collector barrier so that most of electrons injected from a first level are reflected by the collector barrier to produce no collector current, electrons from a second level or electrons thermally excited pass over the collector barrier to produce a collector current, and the negative differential characteristics of the transistor being designed such that a forward peak current of the first emitter is smaller than a reverse peak current of the second emitter; and the first emitter being connected to the ground line, the second emitter being connected to the word line, and the collector being connected to the bit line, the memory cell having the first and second base-emitter junctions that form, with the base layer, the series circuits to provide the two stable operation points involving low and high base potentials, respectively, wherein the method comprises the steps of applying a potential, which is lower than a sustain potential, to the bit line when writing data to the first stable operation point; applying a sustain potential to the bit line when writing data to the second stable operation point; and applying a potential, which is sufficiently low to destruct the two stable operation points, to the word line, applying a potential, which is higher than the sustain potential, to the word line, and again applying the sustain potential to the word line, to thereby write the data to the memory cell.

In addition, according to the present invention, there is also provided a method of writing data to a memory cell of a semiconductor memory, the semiconductor memory having a plurality of bit lines, a plurality of word lines, a plurality of ground lines, and a plurality of memory cells, each of the bit lines intersecting each of the word and the ground lines, to form an intersection where the memory cell is arranged, and the memory cell comprises a double-emitter resonance-tunnel-hot-electron transistor having a collector, a first emitter, and a second emitter, each emitter-base junction of the transistor having an N-shaped negative differential current-voltage characteristic that shows a relatively small gain up to a peak current and a relatively large gain after a valley current, the transistor having a resonance tunnel barrier and a collector barrier so that most of electrons injected from a first level are reflected by the collector barrier to produce no collector current, and electrons from a second level or electrons thermally excited pass over the collector barrier to produce a collector current, the negative differential characteristics of the transistor being designed such that a forward peak current is larger than a reverse peak current, and the reverse peak current being larger than the product of the forward peak current and a current gain at a resonance peak with given voltages being applied to the collector and the emitters; and the first emitter being connected to the ground line, the second emitter being connected to the word line, and the collector being connected to the bit line, the memory cell having the first and second base-emitter junctions that form, with the base layer, the series circuits to provide the two stable operation points involving low and high base potentials, respectively, wherein the method comprises the steps of: applying a sustain potential to the bit line when writing data to the first stable operation point; applying a potential, which is higher than the sustain potential, to the bit line when writing data to the second stable operation point; and applying a potential, which is sufficiently low to destruct the two stable operation points, to the word line, applying a potential, which is higher than the sustain potential, to the word line, and applying the sustain potential to the word line, to thereby write the data to the memory cell.

The number of memory cells connected to a given word line may be smaller than the number of bits to which data is written, data stored in memory cells to which no data is written may be once read, and the read data may be again written to the memory cells at write timing.

BRIEF DESCRIPTION OF THE DRAWINGS

The present invention will be more clearly understood from the description of the preferred embodiments as set forth below with reference to the accompanying drawings, wherein:

FIG. 3A shows the layer structure of a memory cell of a semiconductor memory according to a first embodiment of the present invention;

FIG. 3B shows the energy band of the structure of FIG. 3A;

FIG. 4A shows the layer structure of a memory cell of a semiconductor memory according to a second embodiment of the present invention;

FIG. 4B shows the energy band of the structure of FIG. 4A;

FIG. 5A shows the layer structure of a memory cell of a semiconductor memory according to a third embodiment of the present invention;

FIG. 5B shows the energy band of the structure of FIG. 5A;

FIG. 6A shows the layer structure of a memory cell of a semiconductor memory according to a fourth embodiment of the present invention;

FIG. 6B shows the energy band of the structure of FIG. 6A;

FIG. 7A shows the layer structure of a memory cell of a semiconductor memory according to a fifth embodiment of the present invention;

FIG. 7B shows the energy band of the structure of FIG. 7A;

FIG. 8A shows the layer structure of a memory cell of a semiconductor memory according to a sixth embodiment of the present invention;

FIG. 8B shows the energy band of the structure of FIG. 8A;

FIG. 9A shows the layer structure of a memory cell of a semiconductor memory according to a seventh embodiment of the present invention;

FIG. 9B shows the energy band of the structure of FIG. 9A;

FIG. 17 explains a sustain operation of a memory cell of a semiconductor memory according to the present invention;

FIGS. 18A to 18C explain a read operation of a memory cell of a semiconductor memory according to the present invention;

FIG. 19 explains a sustain operation of a memory cell of a semiconductor memory according to the present invention;

FIGS. 20A to 20C explain a read operation of a memory cell of a semiconductor memory according to the present invention;

FIGS. 22A to 22G explain another write operation of the memory cell according to the present invention;

FIG. 23 explains a sustain operation of a memory cell of a semiconductor memory according to the present invention;

FIGS. 24A to 24C explain a read operation of a memory cell of a semiconductor memory according to the present invention;

FIGS. 27A and 27B explain the operation of a memory cell of a semiconductor memory according to the present invention that is not rewritten;

FIGS. 28A and 28B explain the operation of a memory cell of a semiconductor memory according to the present invention that is rewritten;

FIGS. 30A and 30B explain the operation of a memory cell of a semiconductor memory according to the present invention that is rewritten.

DESCRIPTION OF THE PREFERRED EMBODIMENTS

Semiconductor memories and methods of writing, reading, and sustaining data to, from, and at the semiconductor memories according to the embodiments of the present invention will be explained.

Figure 1:
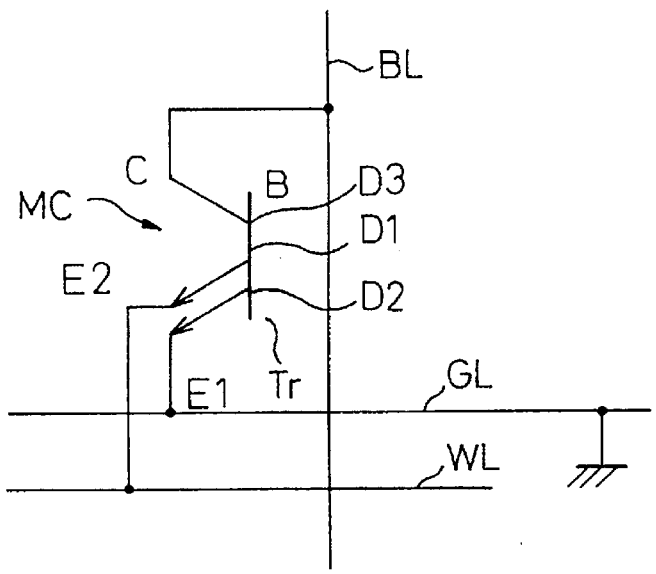
FIG. 1 shows an equivalent circuit of a memory cell of a semiconductor memory according to the present invention.

FIG. 1 shows an equivalent circuit of a memory cell of a semiconductor memory according to an embodiment of the present invention. The memory cell MC has a bit line BL, a word line WL, and a ground line GL.

The bit line BL intersects the word line WL and ground line GL, to form an intersection where the memory cell MC is arranged. The memory cell MC is made of a double-emitter transistor Tr having a collector C, a first emitter E1, and a second emitter E2. The base-emitter junctions of the transistor have each an N-shaped negative differential current-voltage characteristic, which shows a relatively small gain up to a peak current and a relatively large gain after a valley current.

More precisely, the transistor Tr is a multiemitter resonance-tunnel-hot-electron transistor (ME-RHET). The first emitter E1 is connected to the ground line GL, the second emitter E2 to the word line WL, and the collector C to the bit line BL. The base B and first emitter E1 of the transistor Tr form the junction D1, the base B and second emitter E2 form the junction D2, and the base B and collector C form a junction D3.

Figure 2:
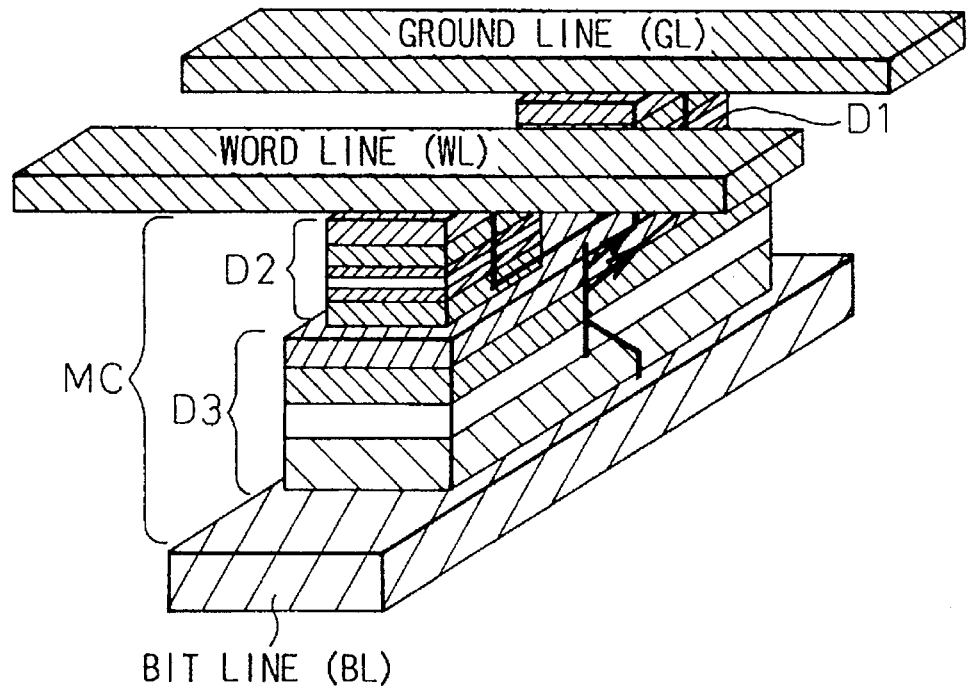
FIG. 2 is a perspective view showing the three-dimensional structure of the memory cell of FIG. 1.

FIG. 2 is a perspective view showing the three-dimensional structure of the memory cell of FIG. 1.

The word line WL and ground line GL are parallel to each other to form a pair and are made from a signal wiring layer. The pair intersects the bit line BL. Between the layer of the word and ground lines and the layer of the bit line, there are layers that form the memory cell MC. A first face of the base-collector junction D3 is electrically connected to the bit line BL. The junction D3 passes a current at a given threshold voltage Vth. A second face of the junction D3 is electrically connected to a first face of the first base-emitter junction D1. A second face of the junction D1 is electrically connected to the ground line GL. The second face of the junction D3 is also electrically connected to a first face of the second base-emitter junction D2, whose second face is electrically connected to the word line WL.

The layer structure of the transistor Tr, i.e., ME-RHET is as mentioned below. The structure employs an Fe-doped InP semiconductor substrate.

| | | Dope concentration | Thickness (nm) |
|---|---|---|---|
| 1) Buffer | i-InAlAs | | 200 |
| 2) Subcollector | n$^{++}$-InGaAs | $5 \times 10^{18}$ | 300 |
| 3) Collector | n$^{+}$-InGaAs | $5 \times 10^{18}$ | 100 |
| 4) Collector barrier | i-InGaAs | | 300 |
| | i-InAlGaAs | | 50 |
| 5) Base | i-InGaAs | | 1.5 |
| | n$^{+}$-InGaAs | $1 \times 10^{18}$ | 27 |
| | i-InGaAs | | d2 |
| 6) Resonance barrier | i-Al$_x$Ga(1 − x)As | | d1 |
| | i-InGaAs | | 7.03 |
| | i-Al$_y$Ga(1 − y)As | | 2.43 |
| 7) Emitter | i-InGaAs | | d3 |
| | n-InGaAs | $1 \times 10^{18}$ | 10 |
| 8) Contact layer | n-InGaAs | $5 \times 10^{19}$ | 150 |
| | n-InGaAs | $1 \times 18^{18}$ to $5 \times 10^{19}$ | 40 |

FIGS. 3A to 9A are sectional views showing the layer structures of memory cells of semiconductor memories according to first to seventh embodiments of the present invention, respectively, and FIGS. 3B to 9B show energy bands of these structures. These memory cells are each made of an ME-RHET (multiemitter resonance tunnel hot electron transistor).

The layer structures of the memory cells of FIGS. 3A to 9B are realized by changing the parameters x, y, d1, d2, and d3 as mentioned below. Although the height of the collector barrier is constant through the embodiments, it is possible to change the height as a parameter.

As shown in the figures, the buffer, subcollector, collector, base, and emitter layers are sequentially laminated on the Fe-doped InP substrate (100), to form the ME-RHET.

The first embodiment of FIGS. 3A and 3B is realized with x=1, y=1, d1=2.43, d2=1.5, and d3=1.5. The i-InGaAs layer of the resonance barrier is thick, i.e., 7.03 nm, similar to the other embodiments. On the other hand, the thickness of a corresponding i-InGaAs layer of a prior art is, for example, 4.0 nm. The i-Al$_x$Ga(1−x)As (i-AlAs) layer of the resonance barrier is 2.43 nm thick. As a result, the resonance tunnel barrier and collector barrier of the ME-RHET of the first embodiment are characterized in that most of electrons injected from a first level are reflected by the collector barrier to produce no collector current, and electrons of second level or thermally excited electrons pass over the collector barrier to produce a collector current.

The second embodiment of FIGS. 4A and 4B is realized with x=1, y=1, d1=2.26, d2=1.5, and d3=1.5. With d1=2.26, the i-Al$_x$Ga(1−x)As (i-AlAs) layer is thinner than that of the first embodiment. Namely, the second embodiment thins the i-AlAs layer of the resonance barrier along the base layer without changing the area of the ME-RHET. As a result, this transistor has a negative differential characteristic in that a forward peak current Ipf1 of the first emitter E1 is smaller than a reverse peak current Ipr2 of the second emitter E2 (Ipf1<Ipr2). Note that the forward peak current Ipf1 is a peak current of the negative differential characteristic at the first emitter E1 where the base is biassed to a positive potential with respect to the potential of the first emitter. Further, the reverse peak current Ipr2 is a peak current of the negative differential characteristics at the second emitter E2 where the base is biased to a negative potential with respect to the potential of the second emitter. This characteristic is also realized by the layer structures of FIGS. 5A and 6A.

The third embodiment of FIGS. 5A and 5B is realized with x=0.9, y=1, d1=2.43, d2=1.5, and d3=1.5. With x=0.9, the i-Al$_x$Ga(1−x)As layer of the resonance barrier is an i-Al$_{0.9}$Ga$_{0.1}$As layer of 2.43 nm thick. The fourth embodiment of FIGS. 6A and 6B is realized with x=1, y=1, d1=2.43, d2=3.0, and d3=1.5. With d2=3.0, the i-InGaAs layer of the base is thicker than that of the first embodiment (FIG. 3A). The third and fourth embodiments are each capable of providing the same negative differential characteristic as that of the second embodiment.

In this way, the present invention thins or lowers a layer of the resonance barrier beside the base of the ME-RHET, or thickens a spacer of the base beside the resonance barrier, so that the ME-RHET may have the negative differential characteristics such so that the forward peak current Ipf1 of the first emitter E1 is smaller than the reverse peak current Ipr2 of the second emitter E2 (Ipf1<Ipr2).

The fifth embodiment of FIGS. 7A and 7B is realized with x=1, y=1, d1=2.70, d2=1.5, and d3=1.5. With d1=2.70, the i-Al$_x$Ga(1−x)As (i-AlAs) layer of the resonance barrier is thicker than that of the first embodiment of FIG. 3A. Namely, the i-AlAs layer beside the base is thickened without changing the area of the ME-RHET. This results in providing a negative differential characteristic so that the forward peak current Ipf is larger than the reverse peak current Ipr, and the reverse peak current Ipr is larger than the product of the forward peak current Ipf and a current gain α at a resonance peak with given voltages being applied to the collector and emitters of the ME-RHET (Ipf>Ipr>Ipf×α). This characteristic is also realized by the layer structures of FIGS. 8A and 9A.

The sixth embodiment of FIGS. 8A and 8B is realized with x=1, y=0.9, d1=2.43, d2=1.5, and d3=1.5. With y=0.9, the i-Al$_y$Ga(1−y)As layer of the resonance barrier is an i-Al$_{0.9}$Ga$_{0.1}$As layer of 2.43 nm thick. The seventh embodiment of FIGS. 9A and 9B is realized with x=1, y=1, d1=2.43, d2=1.5, and d3=3.0. With d3=3.0, the i-InGaAs layer of the emitter is thick. Any one of the sixth and seventh embodiments realizes the same negative differential characteristic as that of the fifth embodiment.

Thickening or heightening a layer of the resonance barrier along the base, or thinning a spacer of the base along the resonance barrier without changing the area of the ME-RHET provides the transistor with the negative differential characteristic so that the forward peak current Ipf is larger than the reverse peak current Ipr and the reverse peak current Ipr is larger than the product of the forward peak current Ipf and a current gain α at a resonance peak with given voltages being applied to the collector and emitters of the ME-RHET (Ipf>Ipr>Ipf×α).

Figure 10:
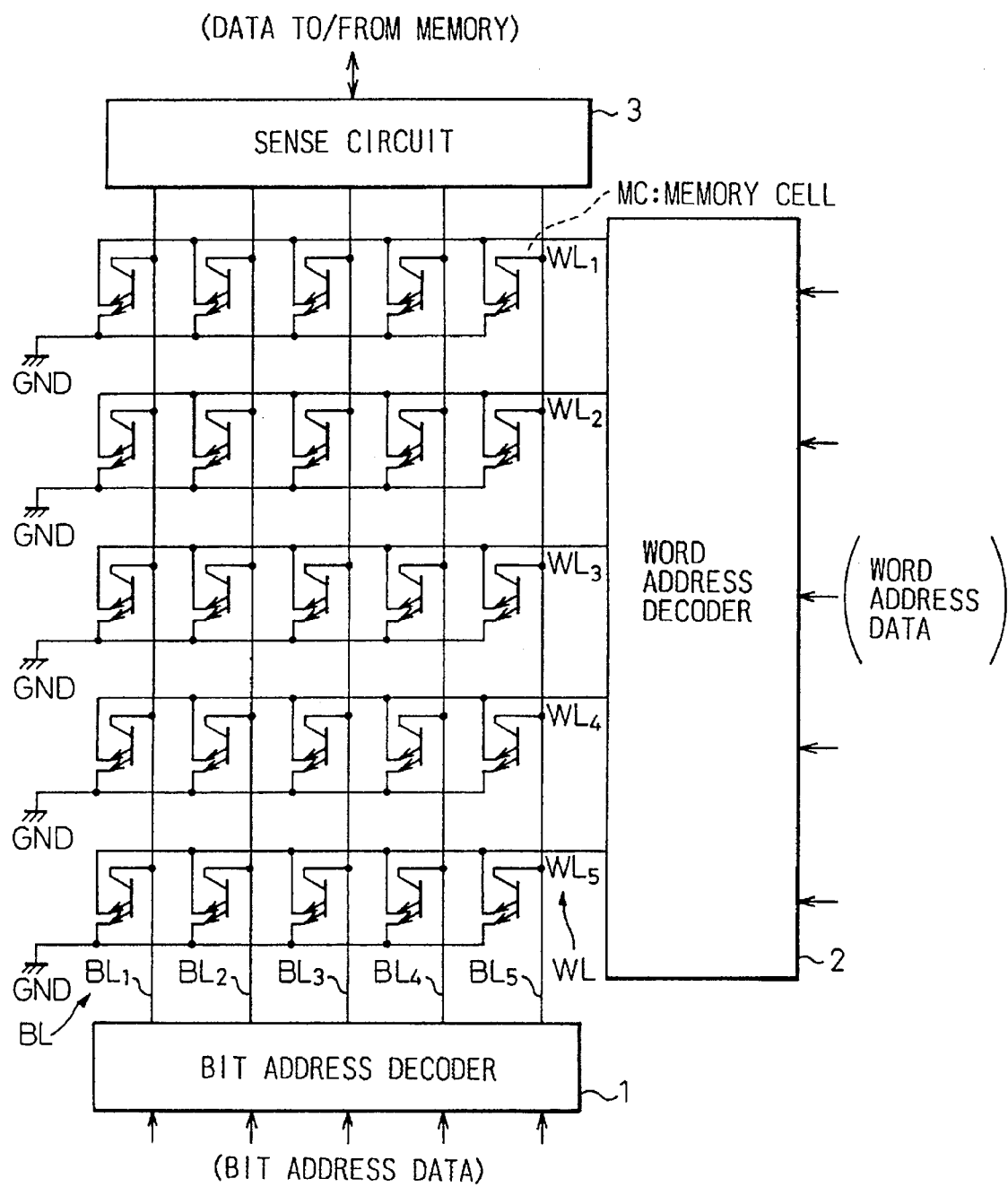
FIG. 10 is a block diagram showing an SRAM according to the present invention.

FIG. 10 is a block diagram showing an SRAM according to the present invention. The SRAM has a bit address decoder 1, a word address decoder 2, and a sense circuit 3. The SRAM consists of a matrix of memory cells each may be the one shown in FIG. 1.

The SRAM has bit lines BL1, BL2, . . . , word lines WL1, WL2, . . . , and ground lines GL1, GL2, . . . . The word and ground lines are parallel to each other and orthogonal to the bit lines. At the intersections of these lines, the memory cells are arranged respectively.

The bit address decoder 1 is connected to the bit lines and provides them with a bit address signal. The sense circuit 3 detects data stored in the memory cells. The word address decoder 2 is connected to the word lines, to provide them with a word address signal. The ground lines are grounded.

Figure 11:
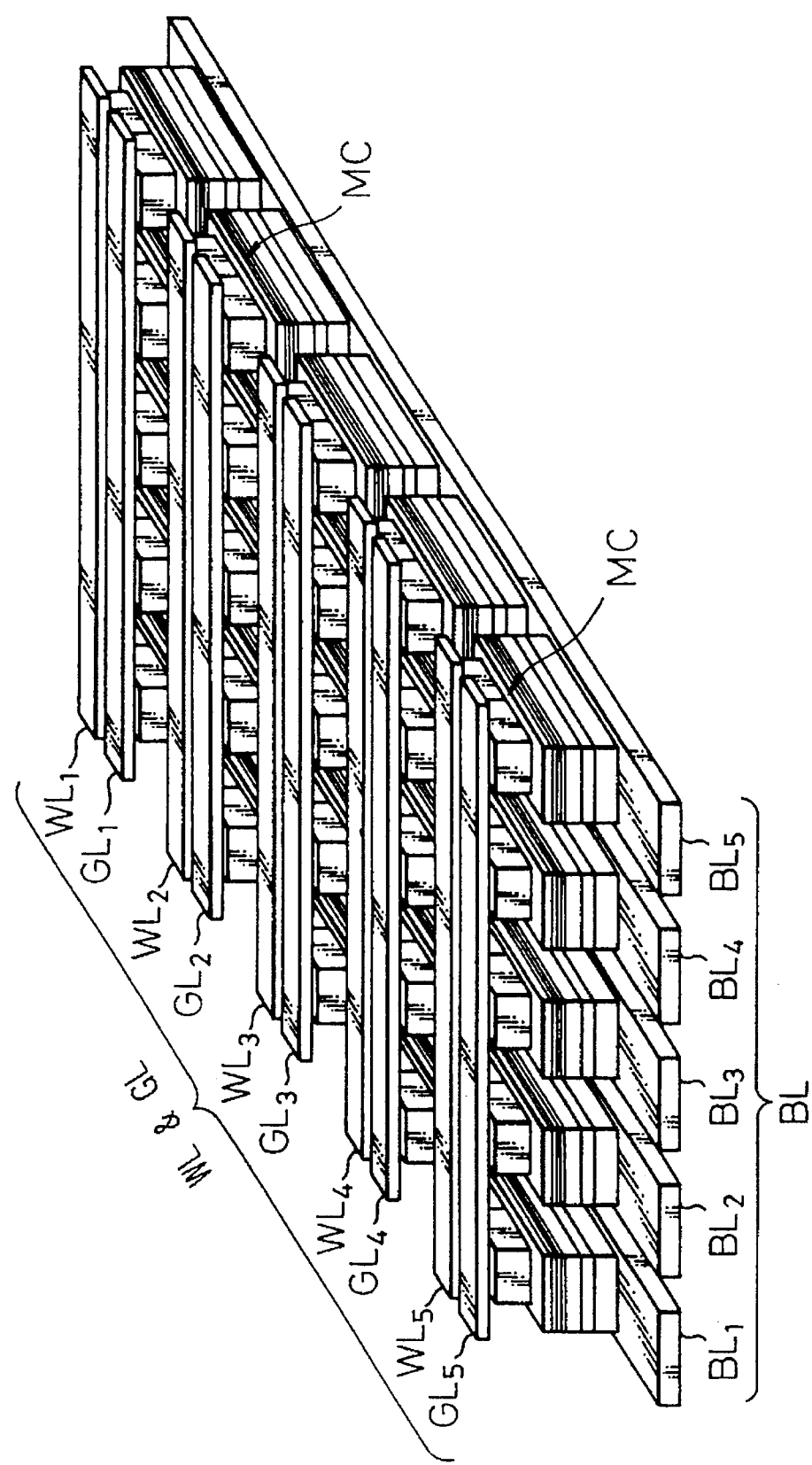
FIG. 11 is a perspective view showing the three-dimensional structure of an SRAM according to the present invention.
Figure 12:
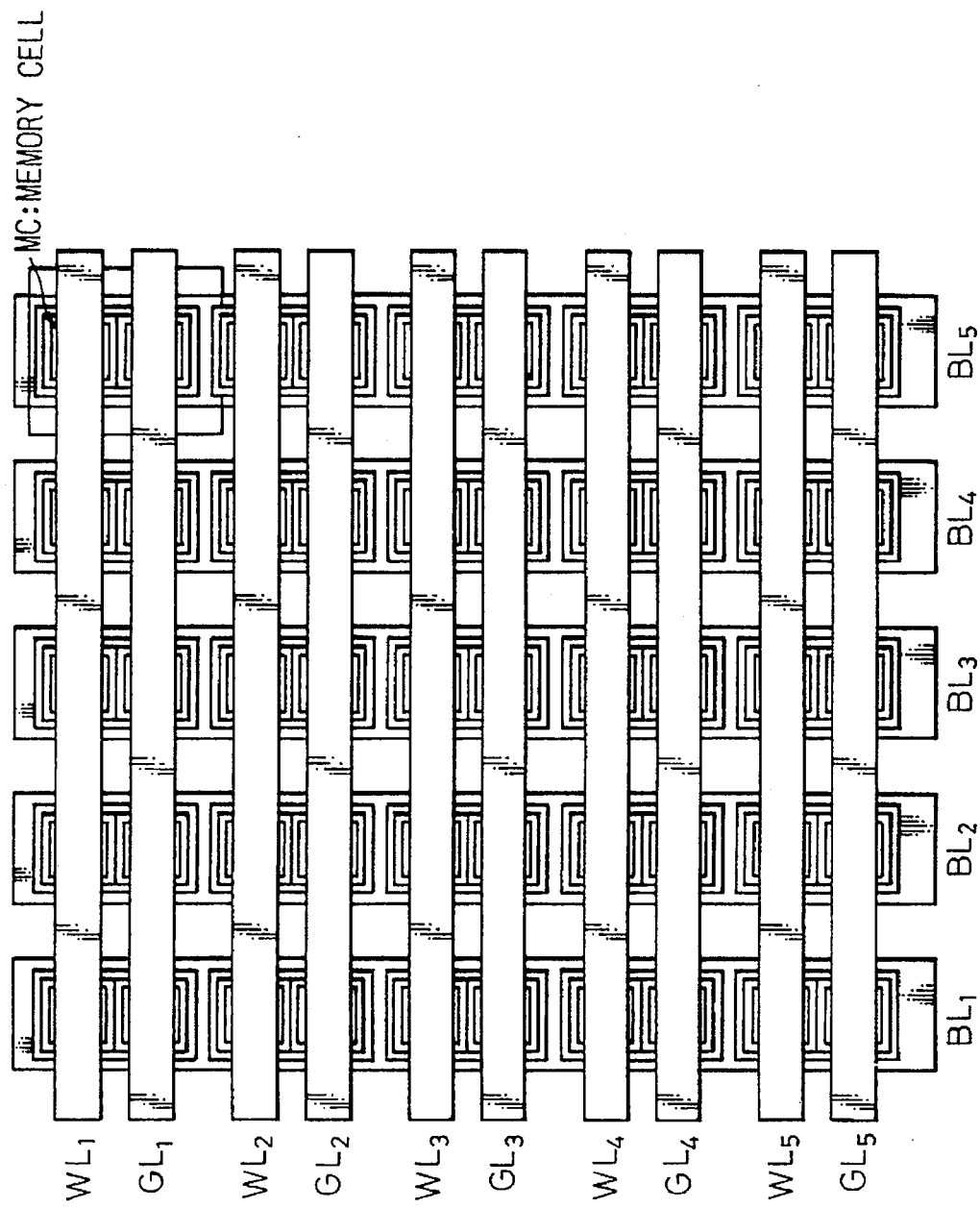
FIG. 12 is a plan view showing the SRAM of FIG. 11.

FIG. 11 is a perspective view showing the three-dimensional structure of an SRAM according to the present invention, and FIG. 12 is a plan view of the same.

The SRAM has bit lines BL1 to BL5 that are in parallel with one another. Pairs of word and ground lines WL1 and GL1 to WL5 and GL5 are electrically not in contact with the bit lines BL1 to BL5 and are orthogonal to the bit lines. At the intersections of these lines, memory cells MC are arranged. Each of the memory cells has a first base-emitter junction D1, a second base-emitter junction D2, and a base-collector junction D3.

The word and ground lines are alternated, so that the area of each memory cell corresponds to about two base-emitter junctions, to realize a high-density arrangement.

Figure 13:
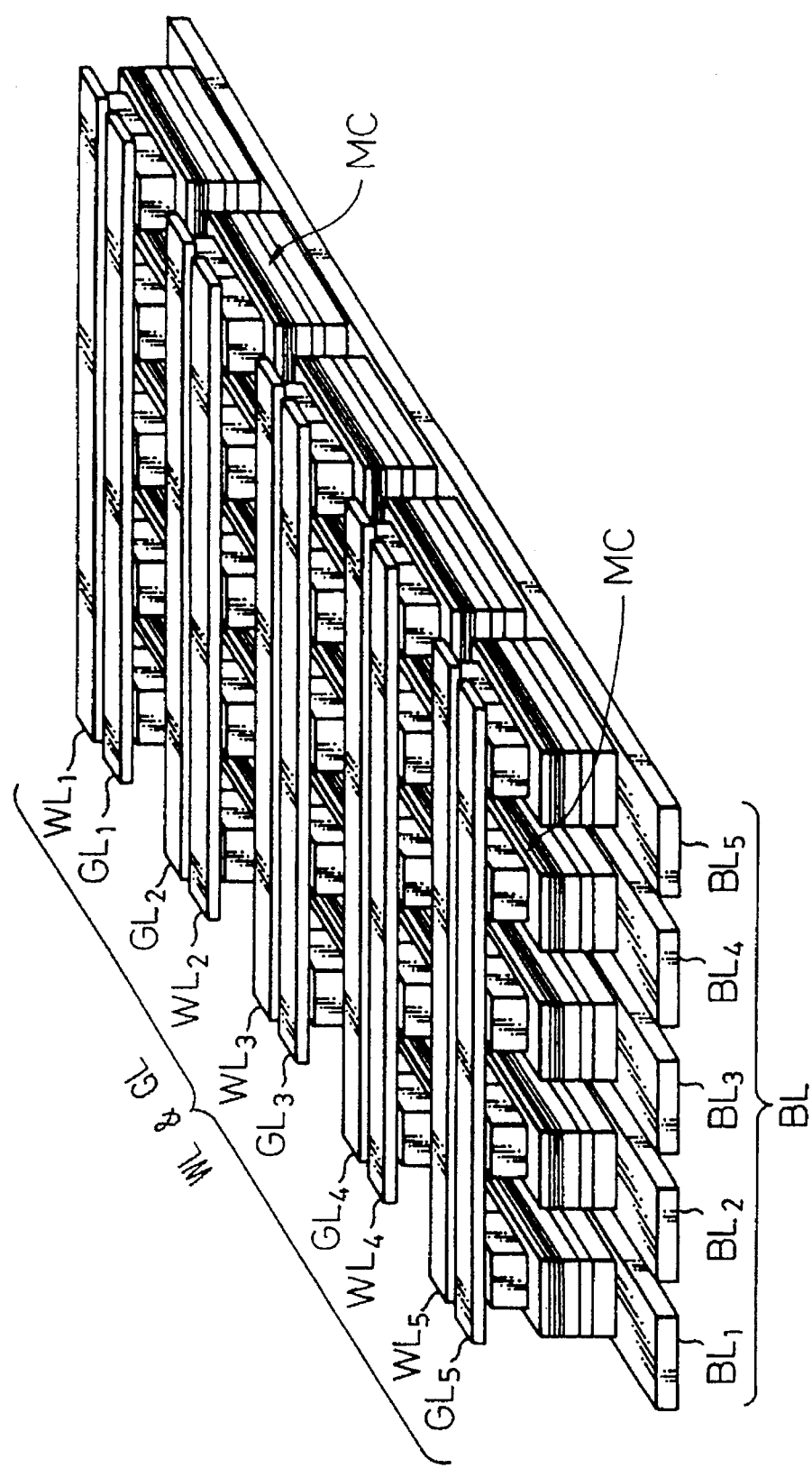
FIG. 13 is a perspective view showing the three-dimensional structure of an SRAM according to the present invention.
Figure 14:
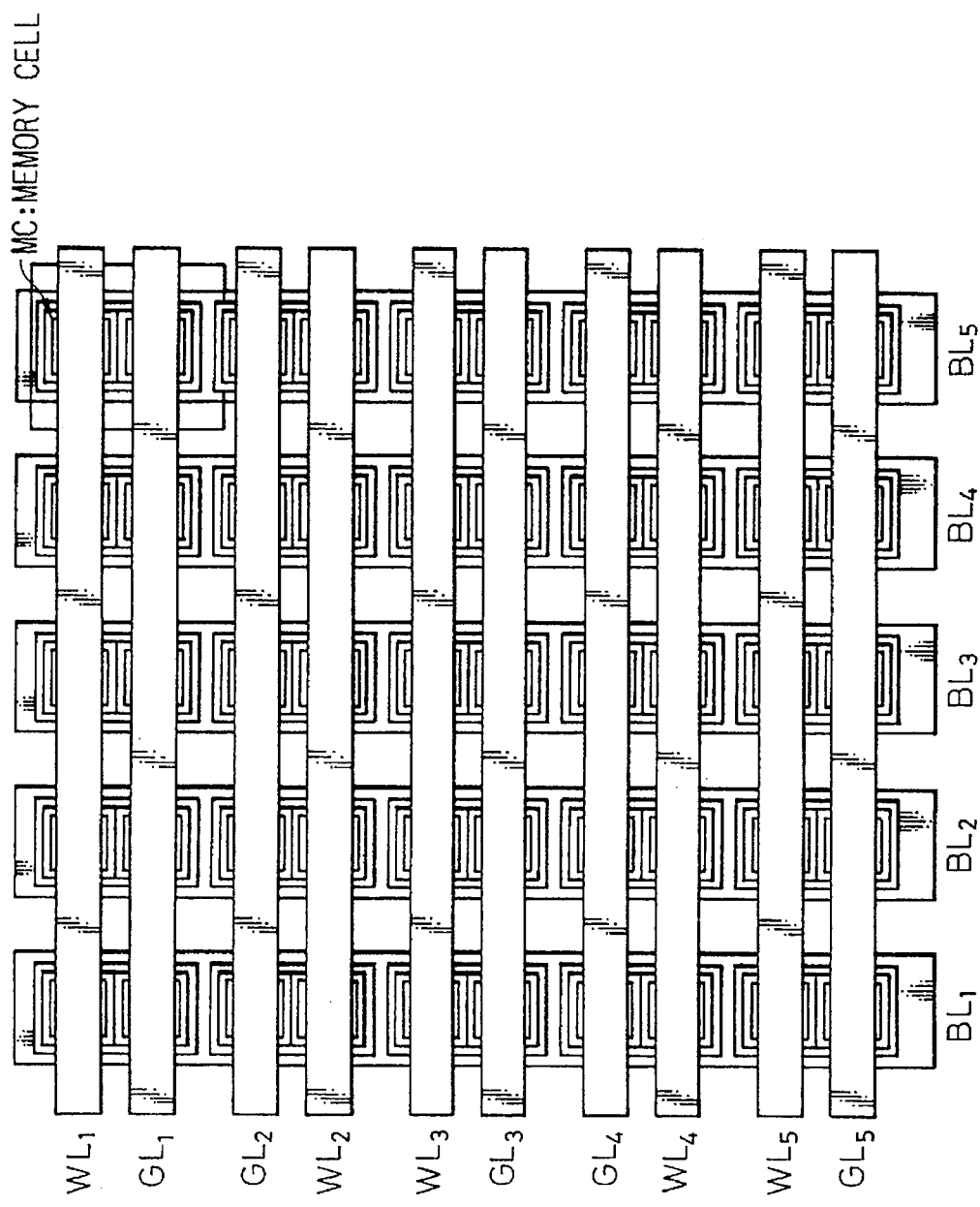
FIG. 14 is a plan view showing the SRAM of FIG. 13.

FIG. 13 is a perspective view showing the three-dimensional structure of an SRAM according to the present invention, and FIG. 14 is a plan view showing the same.

The SRAM has word lines WL1, WL2, . . . and ground lines GL1, GL2, . . . alternated two by two.

Figure 15:
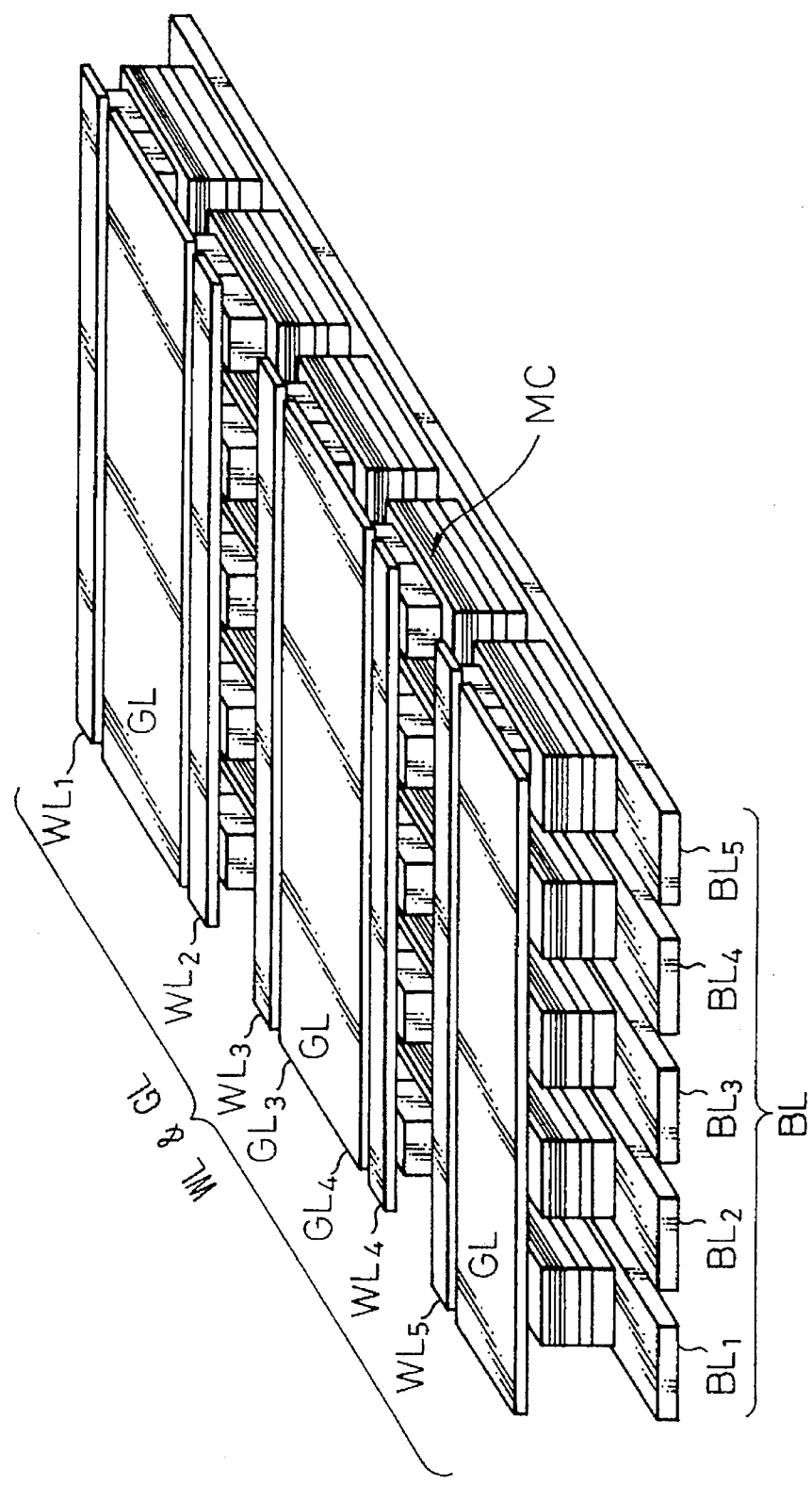
FIG. 15 is a perspective view showing the three-dimensional structure of an SRAM according to the present invention.
Figure 16:
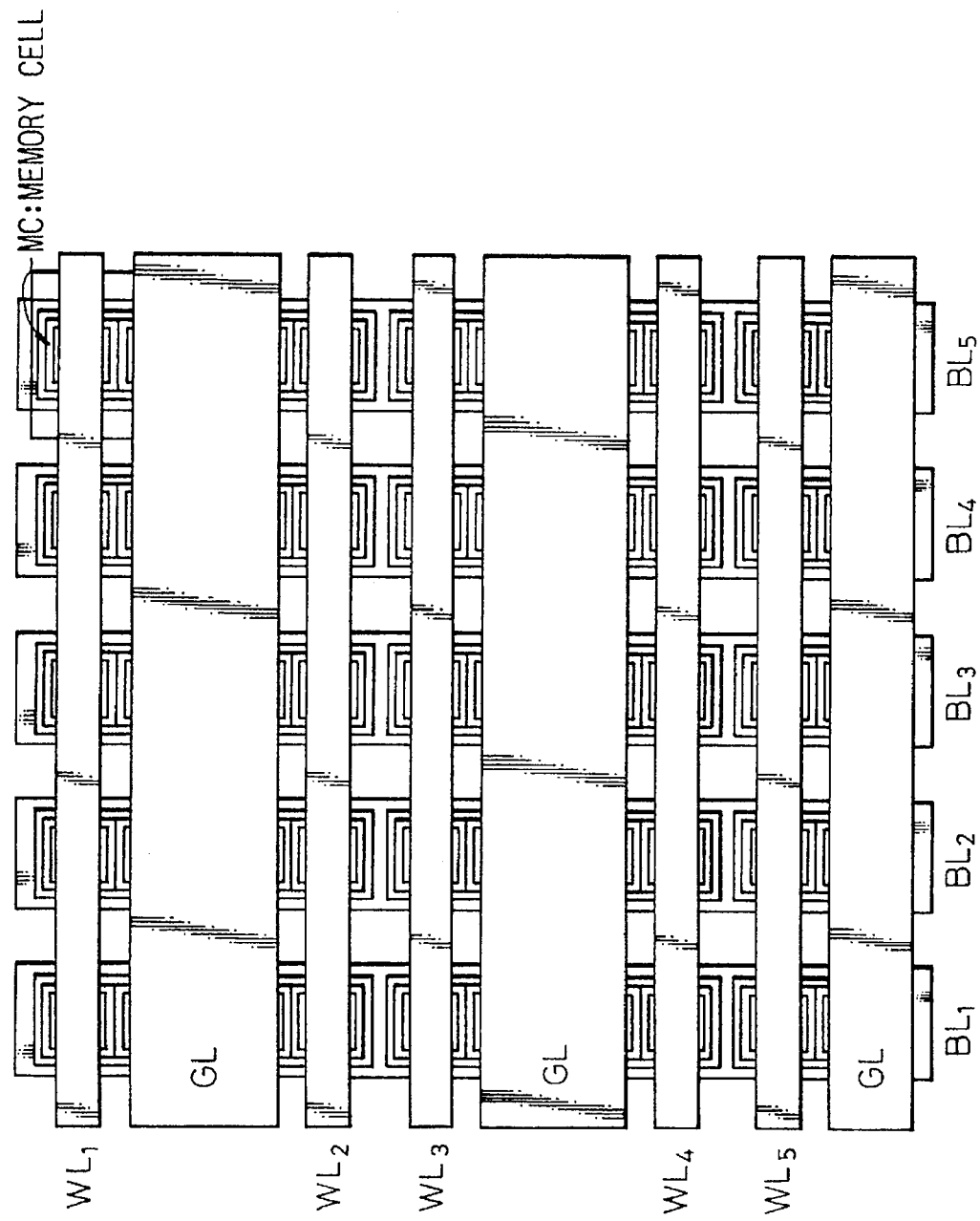
FIG. 16 is a plan view showing the SRAM of FIG. 15.

FIG. 15 is a perspective view showing the three-dimensional structure of an SRAM according to the present invention, and FIG. 16 is a plan view showing the same.

Two adjacent ground lines are integrated into one. For example, ground lines GL1 and GL2 are integrated into one, and ground lines GL3 and GL4 are integrated into one. Each integrated ground line is capable of flowing a large current, or the area of each integrated ground line may be reduced to pass a given current, to thereby realize a high-density arrangement.

To write data to a given memory cell according to any one of the embodiments of FIGS. 11 to 16, a bit address is given to the bit address decoder 1 and a word address is given to the word address decoder 2, to select the given memory cell. In this way, each memory cell is selected according to its address, to write and read data to and from the same. Voltages applied to the bit line BL and word line WL of a memory cell and the operation of writing data to the memory cell will be explained next with reference to FIGS. 17 to 28B.

Figures 17, 18A:
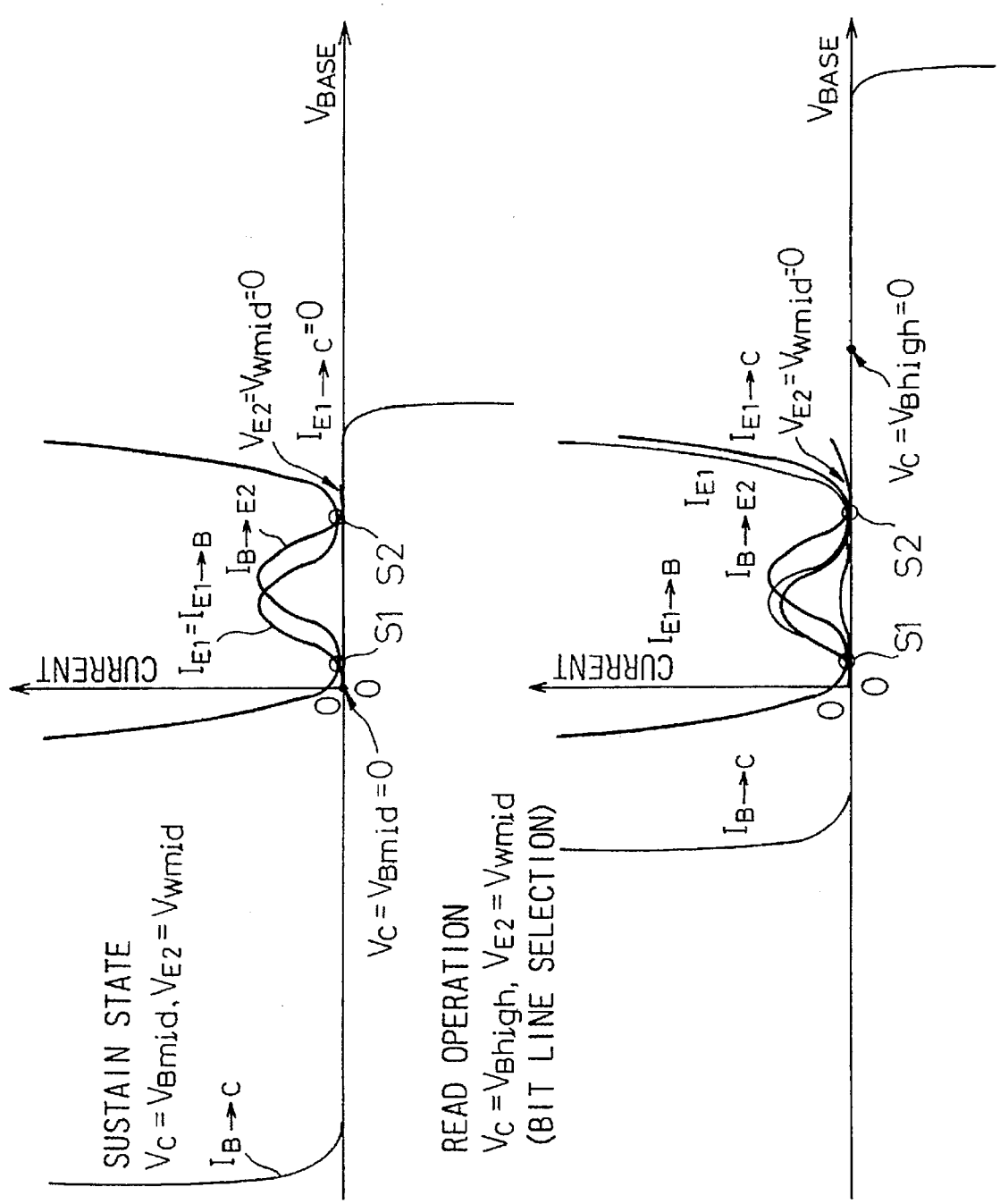

FIG. 17 explains a sustain operation of a memory cell of a semiconductor memory according to the present invention, and FIGS. 18A to 18C explain a read operation of the same.

In FIG. 17, the memory cell is made of a transistor Tr such as an ME-RHET. The transistor has a base B, a collector C, and first and second emitters E1 and E2 and is operable at two stable operation points S1 and S2. A current IE1–B (IE1) flows from the first emitter E1 to the base B, a current IE1–C from the first emitter E1 to the collector C, and a current IB–E2 from the base B to the second emitter E2. A voltage VC is applied to the collector C through a bit line BL, and a voltage VE2 is applied to the second emitter E2 through a word line WL. Here, VC=VBmid=0, and VE2= VWmid=0.

The memory cell, i.e., the transistor has first and second base-emitter junctions D1 and D2 and a base-collector junction D3. The junctions D1 and D2 and a base layer form series circuits that produce the two stable operation points S1 and S2. To sustain data written to the memory cell, VWmid (VE2)=0 V is applied to the second emitter E2 through the word line WL, to bias the transistor to the valley of the N-shaped negative differential characteristic of the transistor. At the same time, VBmid (VC)=0 V is applied to the collector C through the bit line BL. The VBmid must be sufficiently low to provide no gain with respect to a ground level (GND) and must be higher than the reverse breakdown voltage (Vrbr) of the base-collector junction D3. In this embodiment, the VBmid is equal to a ground level of 0 V.

FIGS. 18A to 18C explain a read operation of the memory cell. As explained above, the memory cell MC has the first base-emitter junctions D1 and D2, which form, 10 together with the base layer, the series circuits that provide the two stable operation points S1 and S2.

In FIG. 18A, a potential VBhigh (VC) is applied to the collector C through the bit line BL so that the transistor Tr provides a sufficient gain. At this time, the operation point S1 involves a low base potential to provide a low gain, and the operation point S2 involves a high base potential to provide a high gain. In FIG. 18B, a high potential VWhigh (VE2) is applied to the second emitter E2 through the word line WL. The VWhigh is higher than the sustain potential but sufficiently low so as not to destruct data stored in the memory cell. In this state, a collector current to the bit line is detected to specify one of the stable operation points S1 and S2, to thereby read the data.

The operation of FIG. 18A selects the bit line BL, the operation of FIG. 18B selects the word line WL, and the operation of FIG. 18C selects both the bit line BL and word line WL. Through these operations, the operation point S1 having a low base potential provides a low gain, and the operation point S2 having a high base potential provides a high gain. The potential VE2=VWhigh applied to the second emitter E2 through the word line WL is higher than the sustain potential but sufficiently low so as not to destruct data stored in the memory cell. In this state, a current flowing through the bit line is detected to specify one of the operation points S1 and S2, to thereby read the data out of the memory cell.

Figure 20B:
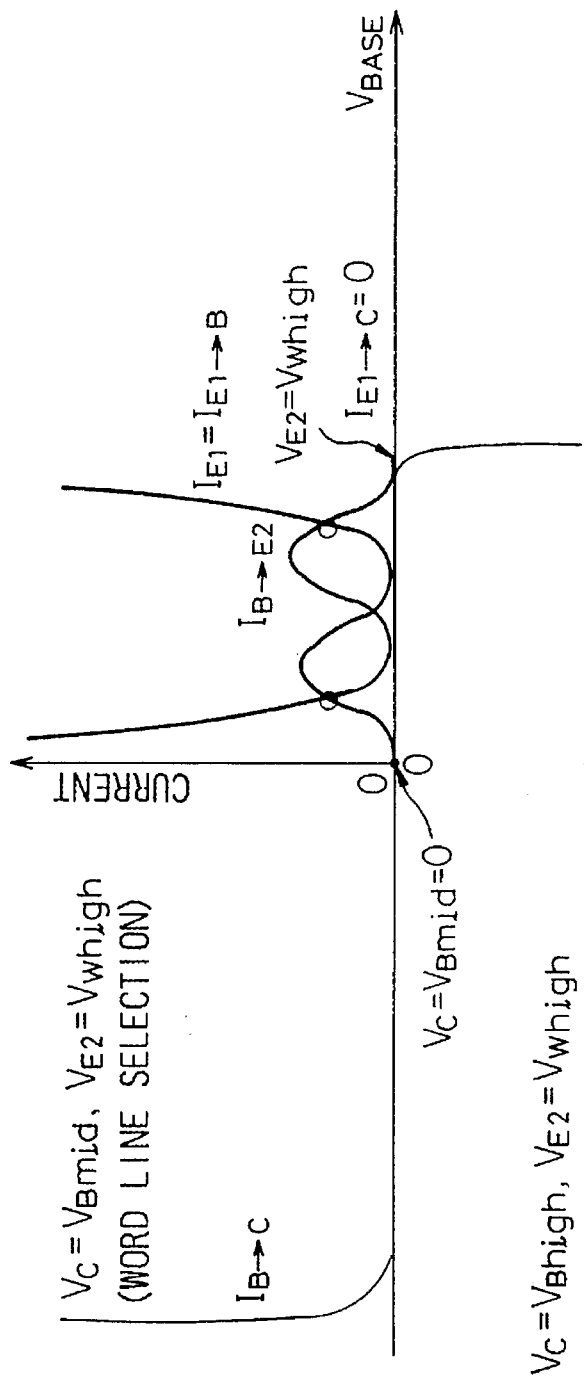
Figure 20C:
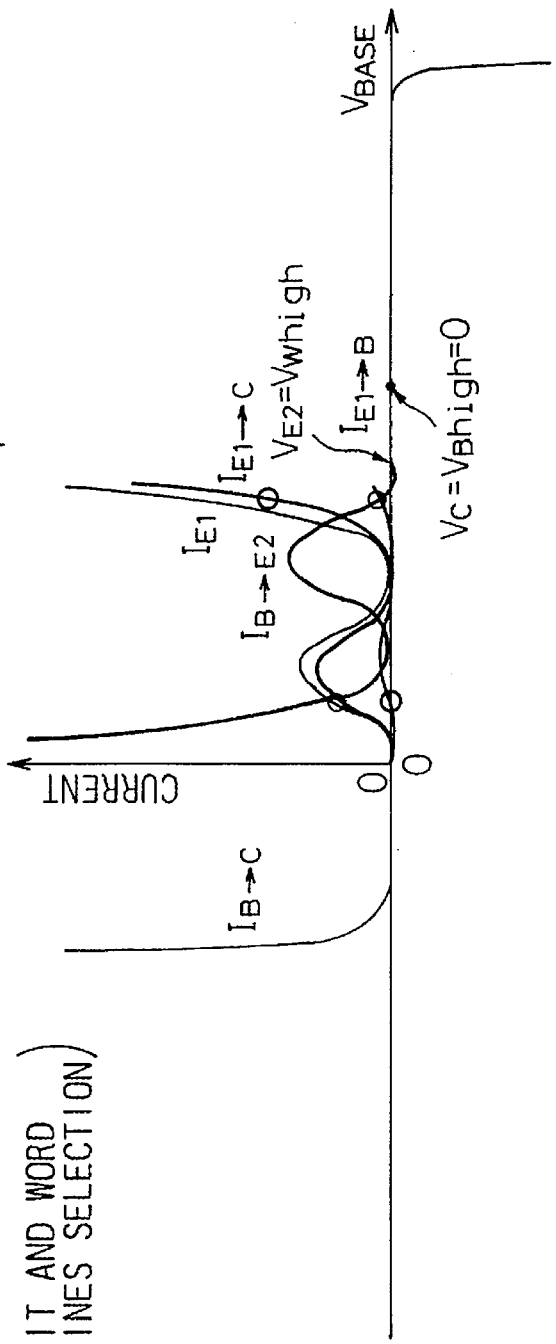

FIG. 19 explains a sustain operation of a memory cell of a semiconductor memory according to the present invention, and FIGS. 20A to 20C explain a read operation of the same.

In FIG. 19, the memory cell MC is made of a transistor Tr such as an ME-RHET having a base B, a collector C, and first and second emitters E1 and E2. The transistor Tr has a negative differential characteristic in which a forward peak current Ipf1 of the first emitter E1 is smaller than a reverse peak current Ipr2 of the second emitter E2 (Ifp1<Ipr2).

The memory cell, i.e., the transistor has first and second base-emitter junctions D1 and D2 and a base-collector junction D3. The junctions D1 and D2 and a base layer form series circuits that produce the two stable operation points S1 and S2. To sustain data written to the memory cell, VWmid (VE2)=0 V is applied to the second emitter E2 through the word line WL, to bias the transistor to the valley of the N-shaped negative differential characteristic. At the same time, VBmid (VC)=0 V is applied to the collector C through the bit line BL. The VBmid must be sufficiently low to provide no gain with respect to a ground level (GND) and must be higher than the reverse breakdown voltage (Vrbr) of the base-collector junction D3. In this embodiment, the VBmid is equal to a ground level of 0 V.

FIGS. 20A and 20C explain a read operation of the memory cell. As explained above, the transistor Tr has the negative differential characteristic in which a forward peak current Ipf1 of the first emitter E1 is smaller than a reverse peak current Ipr2 of the second emitter E2 (Ipf1<Ipr2). The memory cell has the base-emitter junctions D1 and D2. The junctions D1 and D2 and the base layer form the series circuits that provide the two stable operation points S1 and S2.

A potential VC=VBhigh is applied to the collector C through the bit line BL so that the transistor Tr provides a sufficient gain. At this time, the operation point S1 involves a low base potential to provide a low gain, and the operation point S2 involves a high base potential to provide a high gain. A high potential VE2=VWhigh is applied to the second emitter E2 through the word line WL. The VWhigh is higher than the sustain potential but sufficiently low so as not to destruct data stored in the memory cell. In this state, a collector current flowing through the bit line is detected to specify one of the stable operation points S1 and S2, to thereby read the data. The operation of FIG. 20A selects the bit line BL, the operation of FIG. 20B selects the word line WL, and the operation of FIG. 20C selects both the bit line BL and word line WL.

FIGS. 21A to 21G explain a write operation of a memory cell of a semiconductor memory according to the present invention. The memory cell is made of a transistor Tr such as an ME-RHET having a base B, a collector C, and first and second emitters E1 and E2. The transistor has first and second base-emitter junctions D1 and D2 and a base-collector junction D3. The junctions D1 and D2 and a base layer form series circuits that provide two stable operation points S1 and S2. The write operation of this embodiment is carried out to the operation point S2 involving a high base potential. A current IB-C flows from the base B to the collector C, a current IE1-B from the first emitter E1 to the base B, a current IB-E2 from the base B to the second emitter E2, and a current IE1-C from the first emitter E1 to the collector C. A voltage VE2 is applied to the second emitter E2 through a word line WL, and a voltage VC is applied to the collector C through a bit line BL.

Figure 21A:
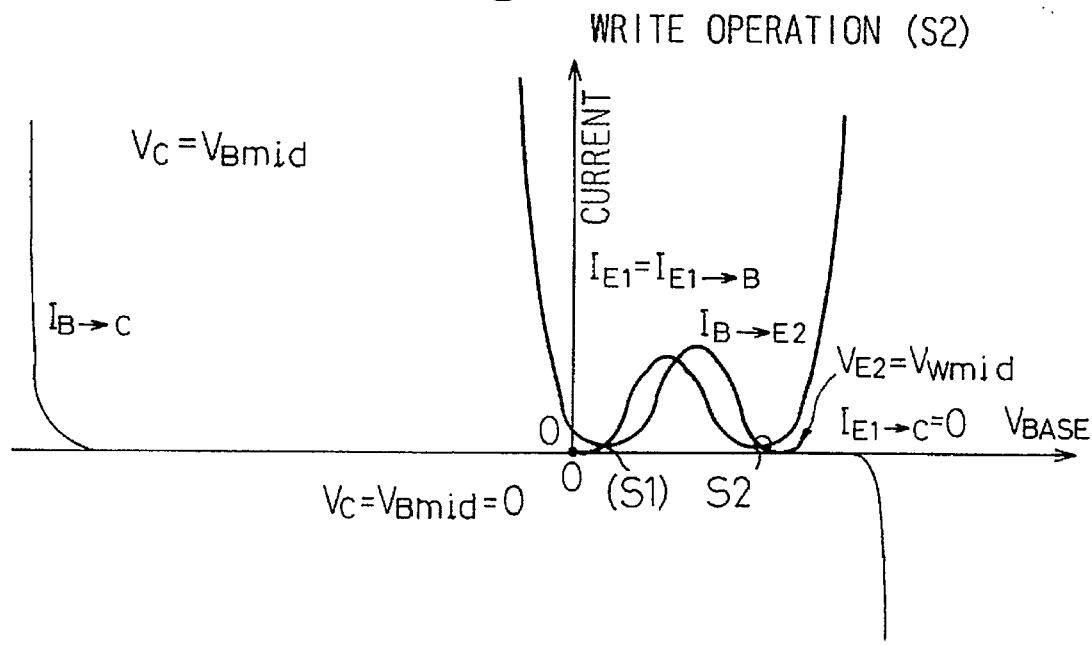
FIGS. 21A to 21G explain a write operation of a memory cell of a semiconductor memory according to the present invention.
Figure 21B:
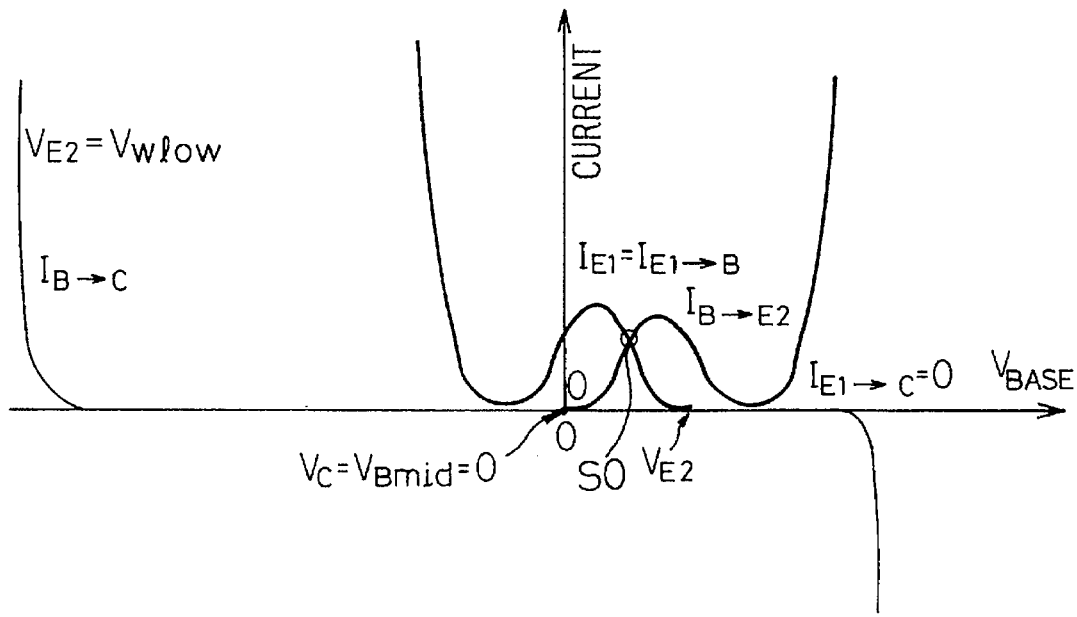

In FIG. 21A, the memory cell has data at one of the operation points S1 and S2. In FIG. 21B, a low potential VWlow=VE2 is applied to the second emitter E2 through the word line WL. The potential VWlow is sufficiently low to destruct the operation points S1 and S2 and establish a monostable operation point S0. At this time, a sustain potential of VC=VBmid=0 V is applied to the collector C through the bit line BL.

Figure 21C:
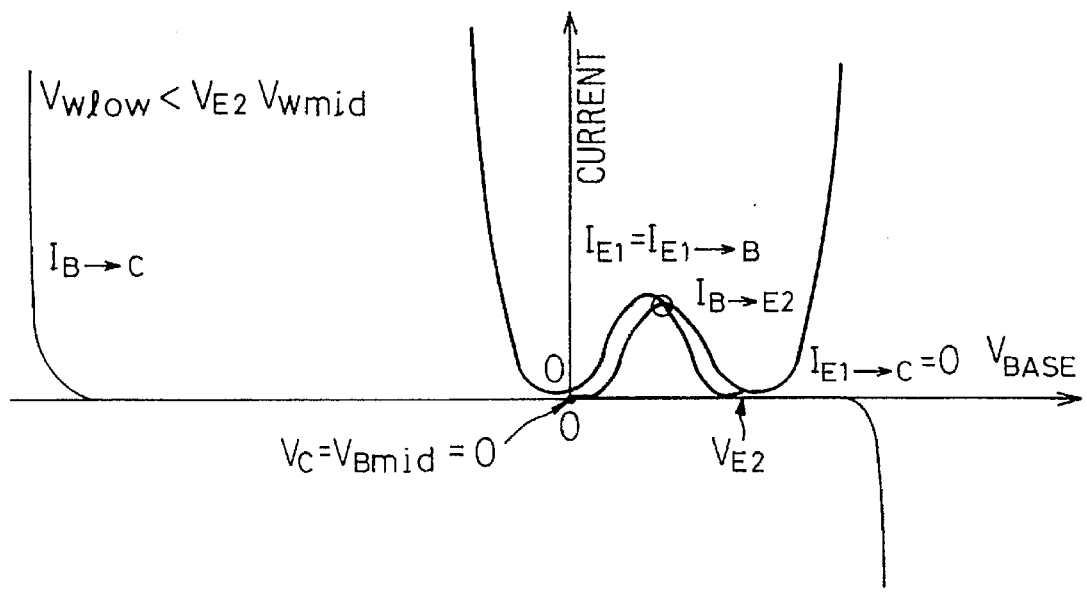
Figure 21D:
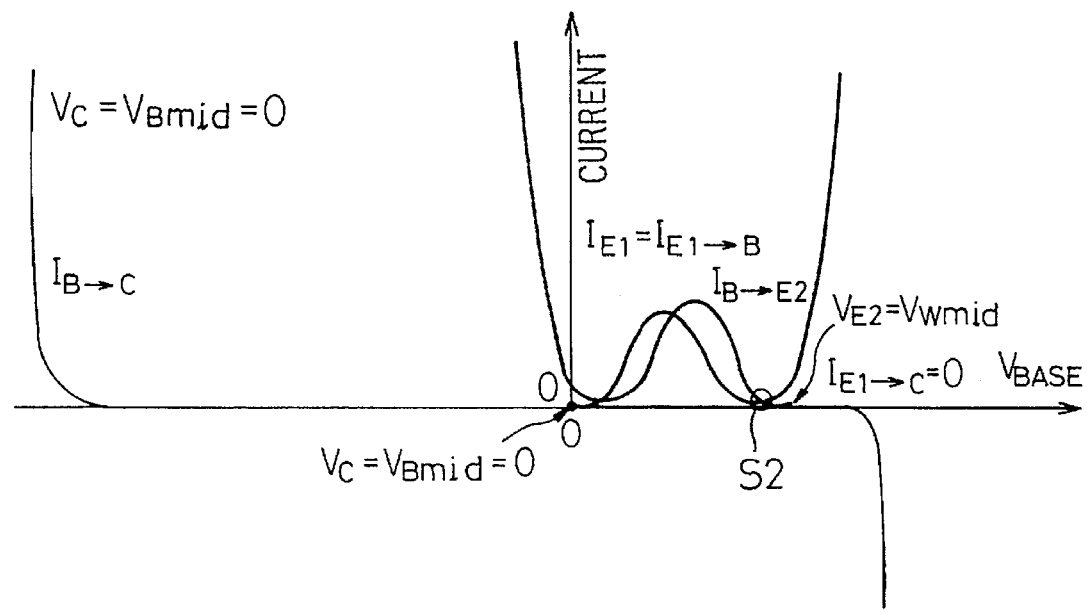

In FIG. 21D, the sustain potential is maintained, and the potential VE2=VWmid is again applied to the second emitter E2 through the word line WL. As a result, the write operation is carried out to the operation point S2 of every memory cell connected to the word line WL in question. FIG. 21C shows a transition period in which the potential applied to the second emitter E2 through the word line WL is changed from the low potential VWlow to the sustain potential VWmid (VWlow<VE2<VWmid).

Figure 21E:
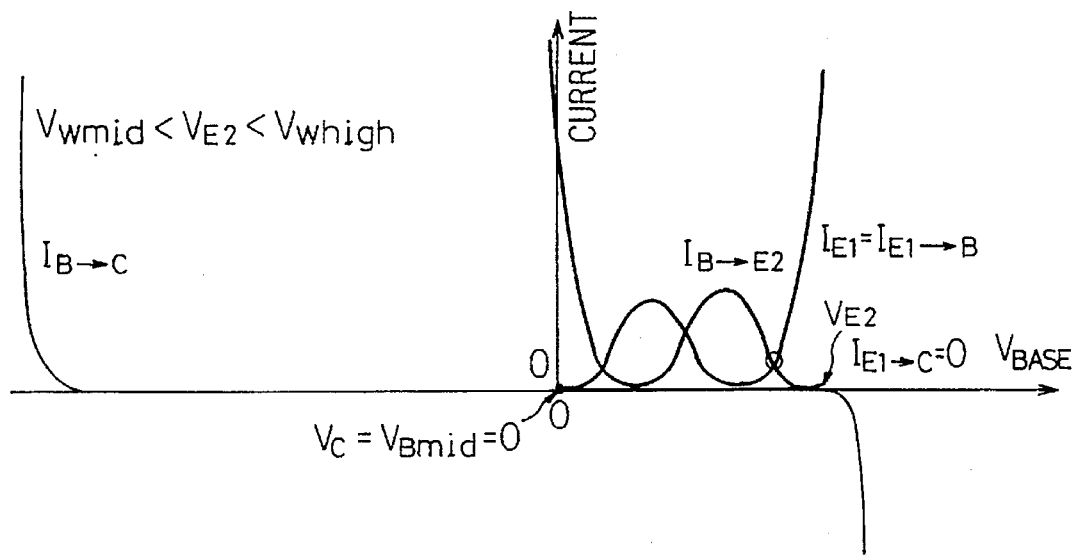
Figure 21F:
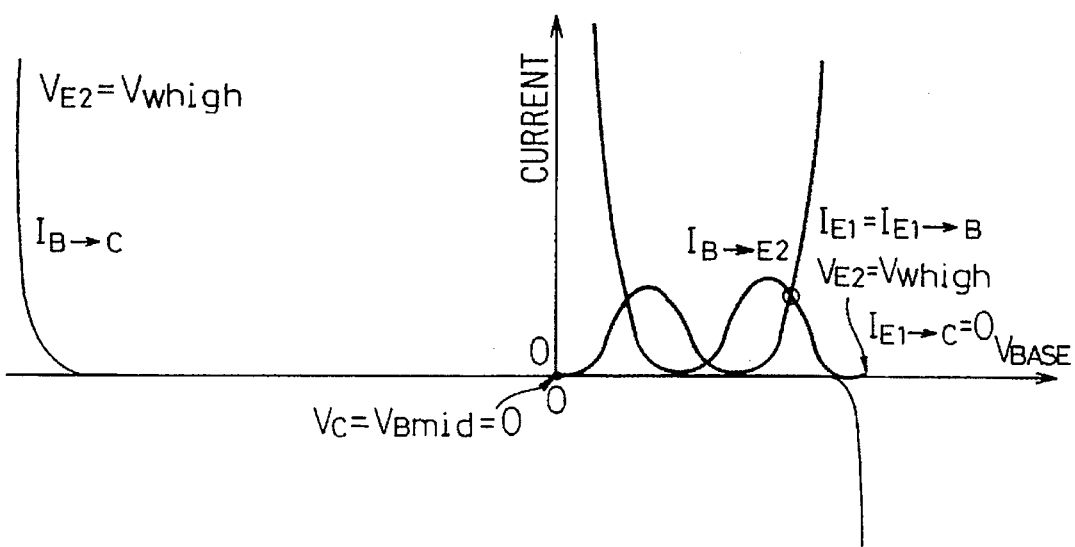

In FIG. 21F, a high potential VE2=VWhigh is applied to the second emitter E2 through the word line WL, to destruct the two stable operation points S1 and S2. FIG. 21E shows a transition period in which the potential applied to the second emitter E2 is changed from the sustain potential VWmid to the high potential VWhigh (VWmid<VE2<VWhigh).

Figure 21G:
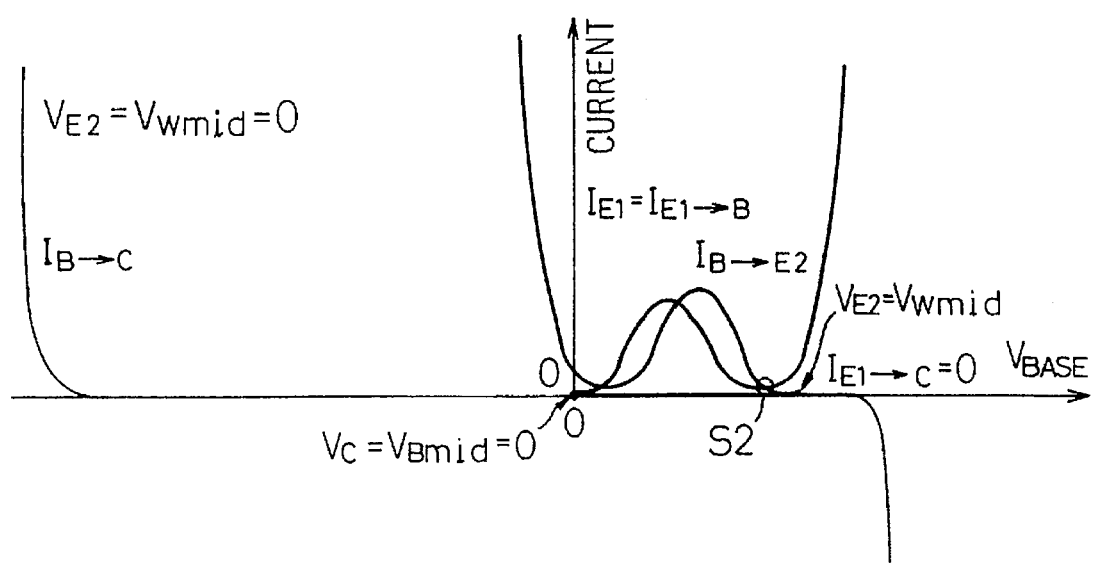

In FIG. 21G, the sustain potential VE2=VWmid is again applied to the second emitter E2 through the word line WL, to write data to the operation point S2 of the memory cell MC.

FIGS. 22A to 22G explain a write operation carried out to the stable operation point S1 involving a low base potential of the memory cell mentioned above.

Figure 22A:
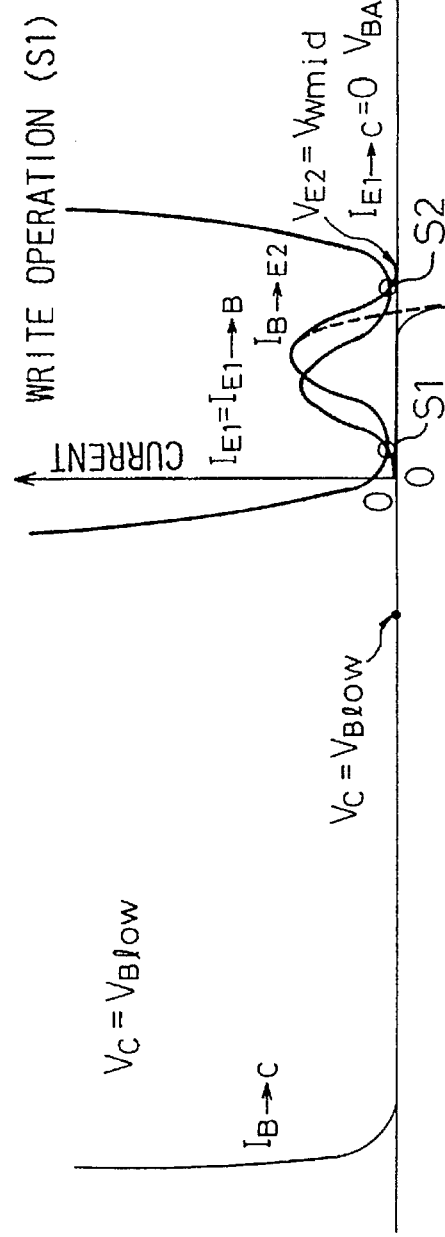
Figure 22B:
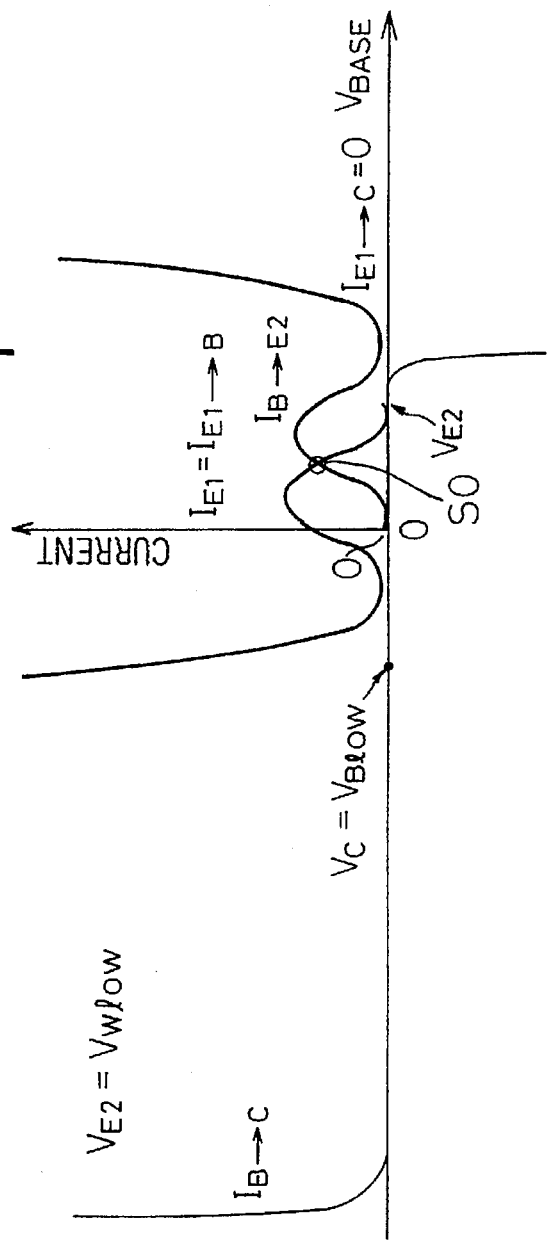
Figures 22C, 22D:
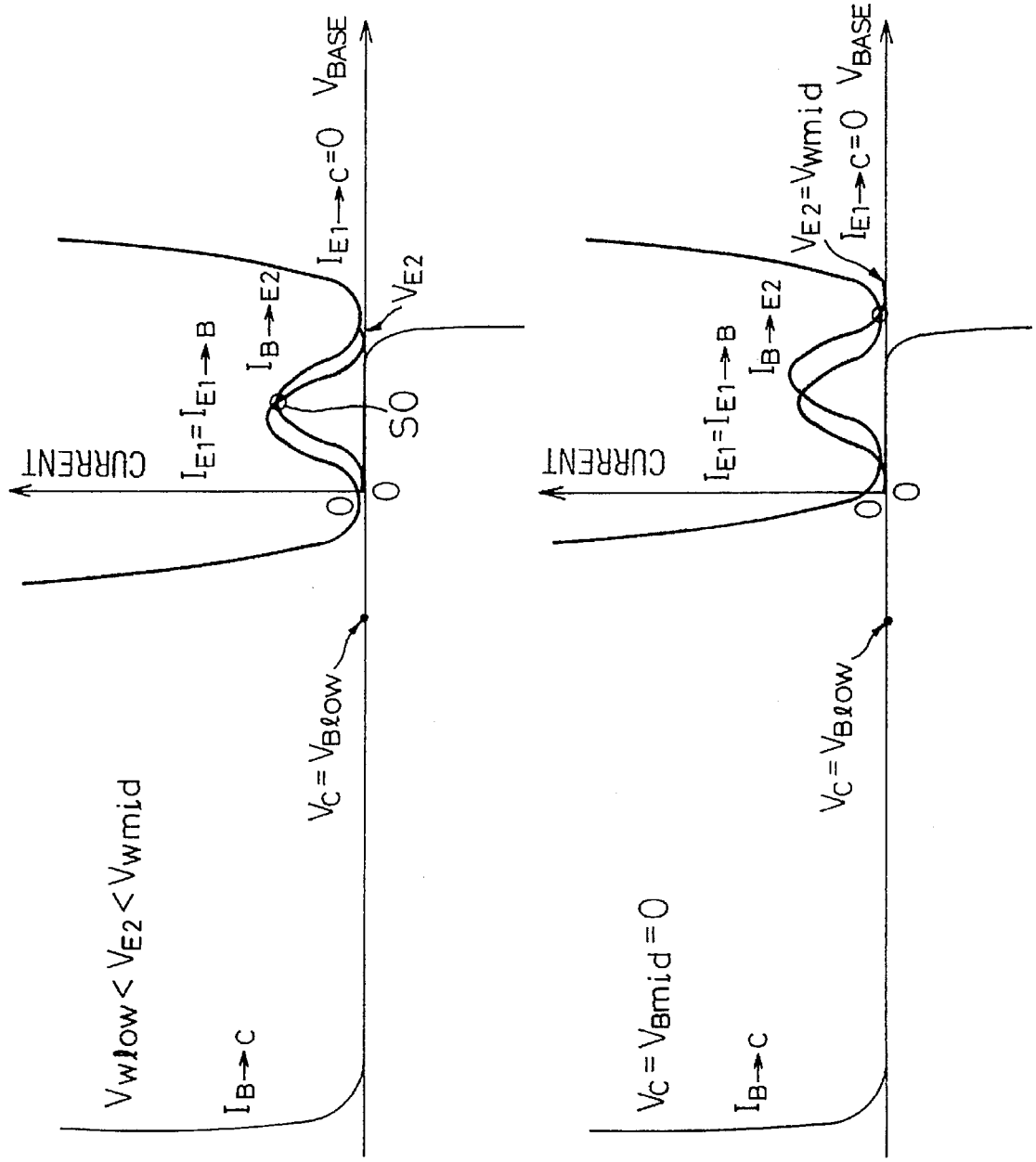

In FIG. 22A, the memory cell has data at one of the operation points S1 and S2. A low potential VC=VBlow is applied to the collector through the bit line BL. The VBlow is lower than a sustain potential. In FIG. 22B, a potential VE2=VWlow, which is lower than a sustain potential, is applied to the second emitter E2 through the word line WL. In FIG. 22D, the sustain potential VE2=VWmid is applied to the second emitter E2 through the word line WL. As a result, the write operation is carried out to the operation point S1 of every memory cell connected to the word line in question. FIG. 22C shows a transition period in which the potential applied to the second emitter E2 through the word line WL is changed from the low potential VWlow to the sustain potential VWmid (VWlow<VE2<VWmid).

In FIG. 22F, a high potential VE2=VWhigh is applied to the second emitter E2 through the word line WL, to destruct the two stable operation points S1 and S2. FIG. 22E shows a transition period in which the potential applied to the second emitter E2 is changed from the sustain potential VWmid t0 the high potential VWhigh (VWmid<VE2<VWmid).

Figure 22G:
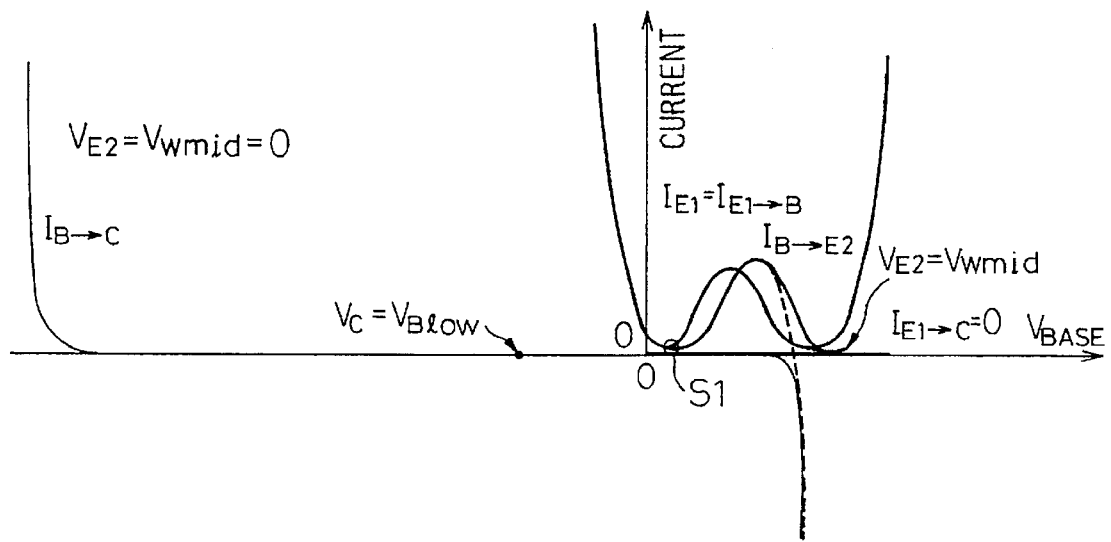

In FIG. 22G, the sustain potential VE2=VWmid is applied to the second emitter E2 through the word line WL, to write data to the operation point S1 of the memory cell MC.

In this way, data is written to any one of the operation points S1 and S2 of the memory cell MC. In principle, the write operation applies a current larger than a peak current to the collector C of the transistor Tr. Accordingly, the present invention is not limited by the peak current that determines a reading speed and the valley current that determines power consumption.

Figures 23, 24A:
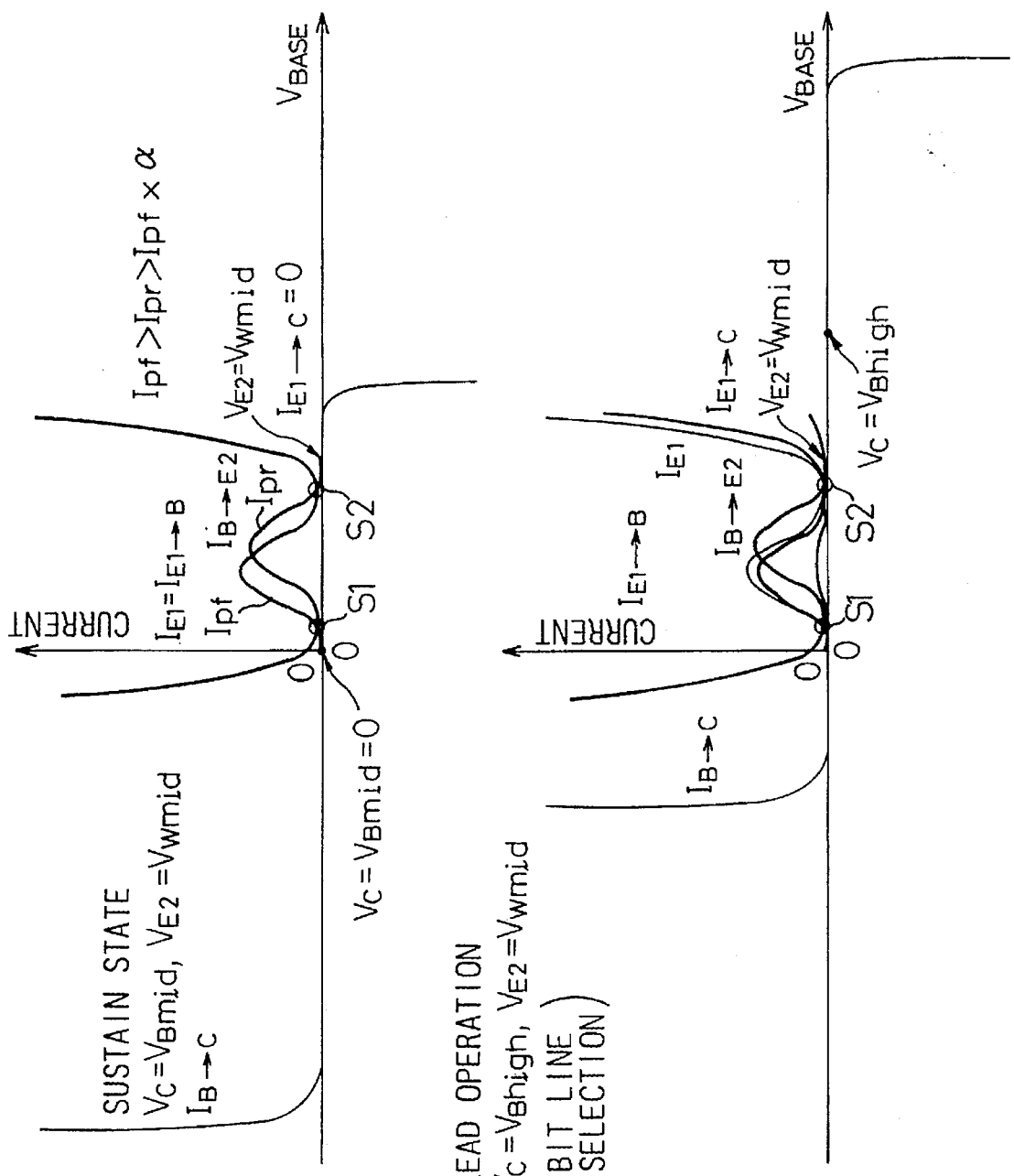

FIG. 23 explains a sustaining operation of a memory cell of a semiconductor memory according to the present invention, and FIGS. 24A to 24C explain a read operation of the same.

In FIG. 23, the memory cell MC is made of a transistor Tr such as an ME-RHET having a base B, a collector C, and first and second emitters E1 and E2. The transistor Tr has a negative differential characteristic in which a forward peak current Ipf is larger than a reverse peak current Ipr, and the reverse peak current Ipr is larger than the product of the forward peak current Ipf and a current gain α at a resonance peak with given voltages being applied to the collector and emitters (Ipf>Ipr>Ipf×α).

The memory cell, i.e., the transistor has first and second base-emitter junctions D1 and D2 and a base-collector junction D3. The junctions D1 and D2 and a base layer form series circuits that provide two stable operation points S1 and S2. To sustain data written to the memory cell, VWmid (VE2)=0 V is applied to the second emitter E2 through the word line WL, to bias the transistor to the valley of the N-shaped negative differential characteristic of the transistor. At the same time, VBmid (VC)=0 V is applied to the collector C through the bit line BL. The VBmid must be sufficiently low to provide no gain with respect to a ground level (GND) and must be higher than the reverse breakdown voltage (Vrbr) of the base-collector junction D3. In this embodiment, the VBmid is equal to a ground level of 0 V.

FIGS. 24A to 24C show a read operation of the memory cell. As explained above, the transistor Tr has the negative differential characteristic in which the forward peak current Ipf is larger than the reverse peak current Ipr, and the reverse peak current Ipr is larger than the product of the forward peak current Ipf and the current gain α at a resonance peak with given voltages being applied to the collector and emitters (Ipf>Ipr>Ipf×α). The memory cell has the base-emitter junctions D1 and D2. The junctions D1 and D2 and the base layer form the series circuits that provide the two stable operation points S1 and S2.

A potential VC=VBhigh is applied to the collector C through the bit line BL so that the transistor Tr provides a sufficient gain. At this time, the operation point S1 involves a low base potential to provide a low gain, and the operation point S2 involves a high base potential to provide a high gain. In FIG. 18B, a high potential VE2=VWhigh is applied to the second emitter E2 through the word line WL. The VWhigh is higher than the sustain potential but sufficiently low so as not to destruct data stored in the memory cell. In this state, a collector current to the bit line is detected to specify one of the stable operation points S1 and S2, to thereby read the data. The operation of FIG. 24A selects the bit line BL, the operation of FIG. 24B selects the word line WL, and the operation of FIG. 24C selects both the bit line BL and word line WL.

In this way, data is written to the operation point S1 of the memory cell MC by properly setting a voltage applied to the collector C. In practice, this voltage is set to the ground potential so that the collector-base junction D3 does not influence the negative differential characteristic. Namely, the collector voltage is set to provide no gain and be below the reverse breakdown voltage of the transistor. The two base-emitter junctions D1 and D2 have the N-shaped negative differential characteristics having different peak currents. When the potential applied to the second emitter E2 through the word line WL is decreased and then increased, the transistor changes from a monostable state to the bistable state. At this time, the operation point of the transistor is uniquely set to S1 according to the mobile operation principle. As explained above, in the ME-RHET, the forward peak current Ipf is larger than the reverse peak current Ipr, and the reverse peak current Ipr is larger than the product of the forward peak current Ipf and the current gain α at a resonance peak with given voltages being applied to the collector and emitters (Ipf>Ipr>Ipf×α). The first emitter E1 connected to the ground provides an emitter current that has a base current component having a first peak. At this time, a current having a second peak flows from the base B to the word line WL through the second emitter E2. When a voltage is applied to the collector C through the bit line BL, the second peak is larger than the first peak, and when no voltage is applied to the collector C through the bit line BL, the first peak is larger than the second peak. When the potential applied to the second emitter E2 through the word line WL is decreased and then increased, the transistor changes from the monostable state to the bistable state. At this time, one of the operation points S1 and S2 is uniquely determined according to the voltage applied to the collector C due to the mobile operation principle. Namely, the write operation is carried out without regard to the breakdown voltage of the ME-RHET. It is possible, therefore, to increase the breakdown voltage of the transistor, to expand the design margins of peripheral circuits.

Figures 25A, 25B:
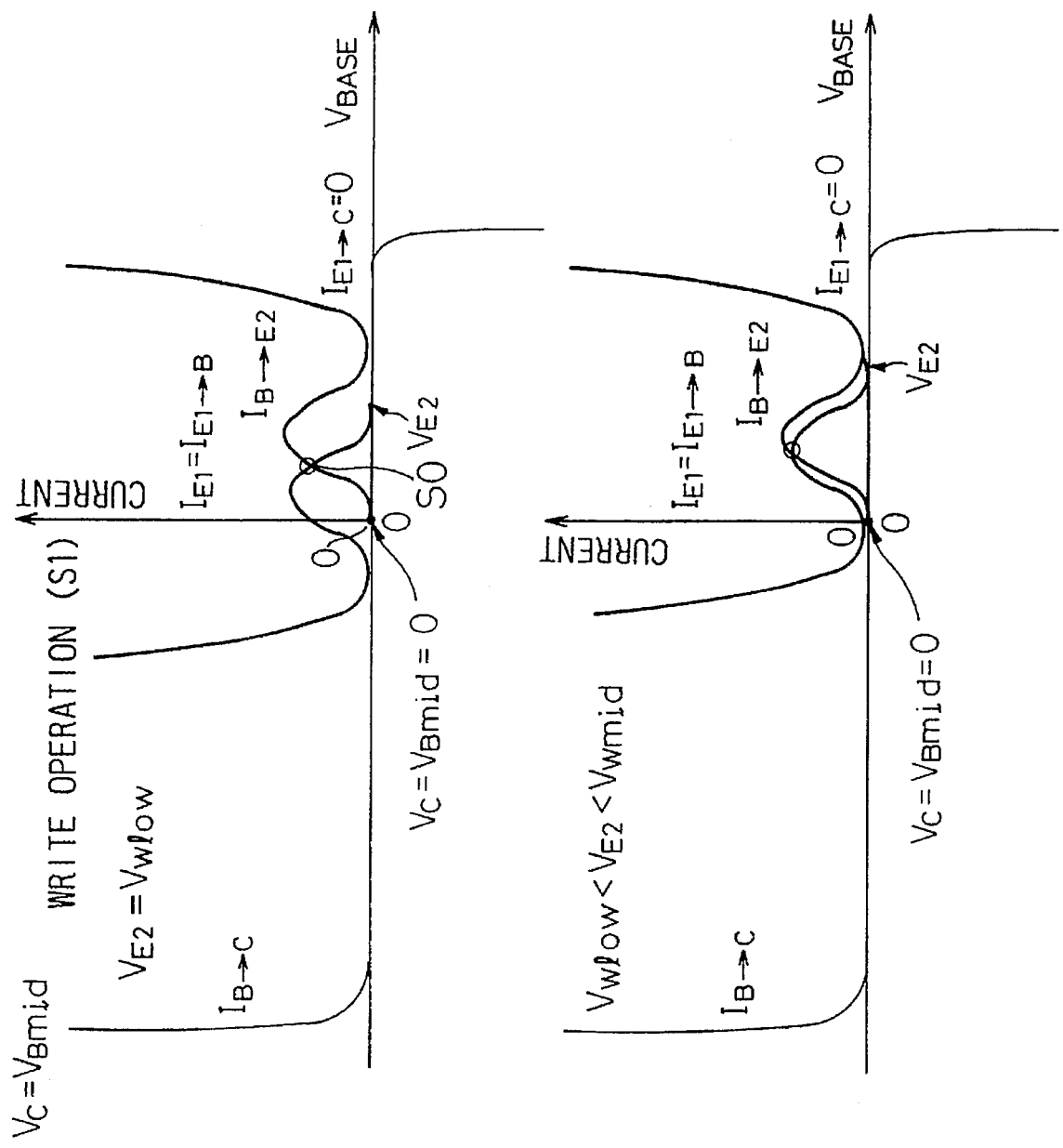
FIGS. 25A to 25C explain a write operation of a memory cell of a semiconductor memory according to the present invention.
Figure 25C:
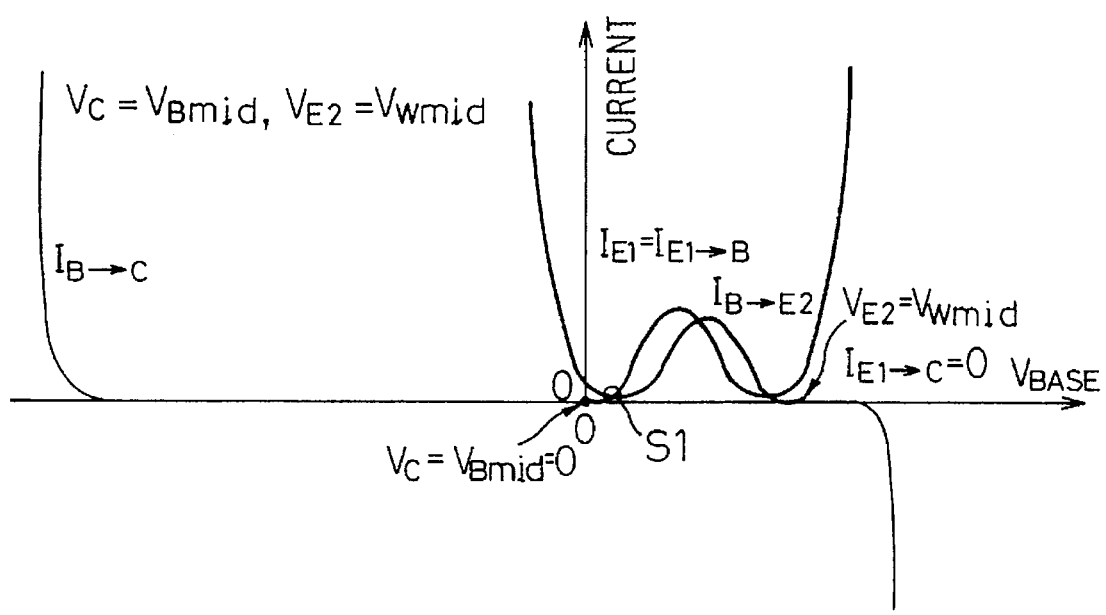

FIGS. 25A to 25C explain a write operation of a memory cell of a semiconductor memory according to the present invention in which FIG. 25A corresponds to FIG. 21B and no figure corresponding to FIG. 21A is shown. The memory cell is made of a transistor Tr such as an ME-RHET having a base B, a collector C, and first and second emitters E1 and E2. The transistor has first and second base-emitter junctions D1 and D2 and a base-collector junction D3. The junctions D1 and D2 and a base layer form series circuits that produce two stable operation points S1 and S2. The write operation of this embodiment is carried out to the operation point S2 involving a high base potential. A current IB-C flows from the base B to the collector C, a current IE1-B from the first emitter E1 to the base B, a current IB-E2 from the base B to the second emitter E2, and a current IE1-C from the first emitter E1 to the collector C. A voltage VE2 is applied to the second emitter E2 through a word line WL, and a voltage VC is applied to the collector C through a bit line BL.

The memory cell has data at one of the operation points S1 and S2. A low potential VWlow=VE2 is applied to the second emitter E2 through the word line WL. The potential VWlow is sufficiently low to destruct the operation points S1 and S2 and establish a monostable operation point S0. At this time, a sustain potential of VC=VBmid=0 V is applied to the collector C through the bit line BL.

In FIG. 25C, the sustain potential is maintained, and the potential VE2=VWmid is again applied to second emitter E2 through the word line WL. As a result, the write operation is carried out to the operation point S1. FIG. 25B shows a transition period in which the 10 potential applied to the second emitter E2 through the word line WL is changed from the low potential VWlow to the sustain potential VWmid (VWlow<VE2<VWmid).

Figure 26A:
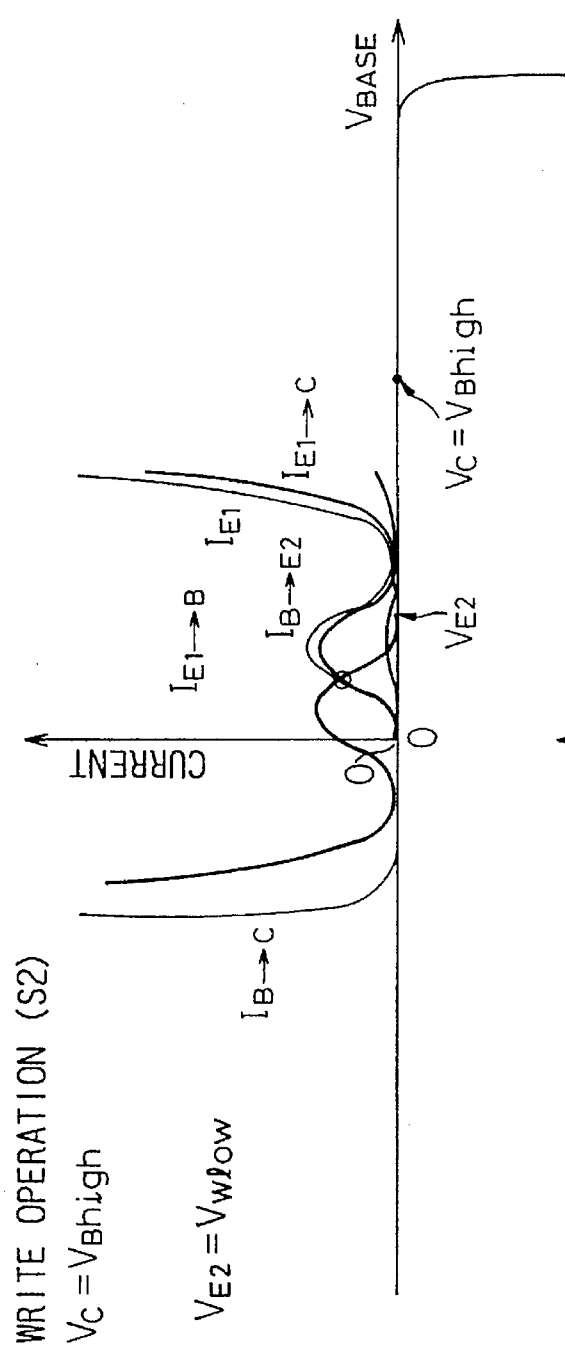
FIGS. 26A to 26C explain another write operation of the memory cell according to the present invention.
Figure 26B:
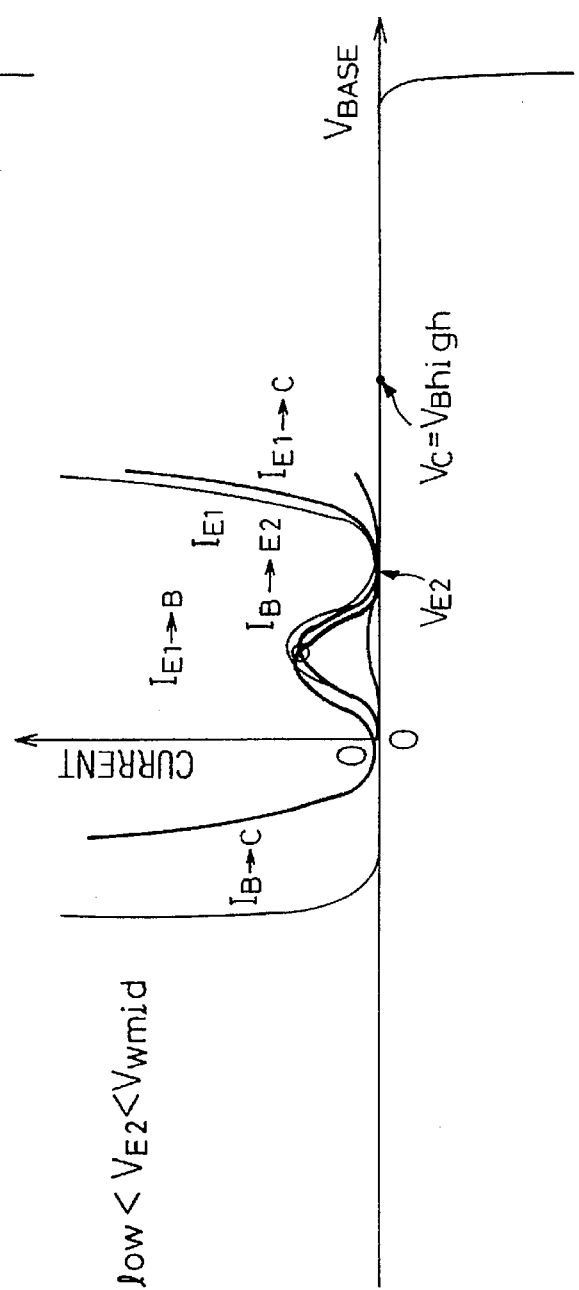
Figure 26C:
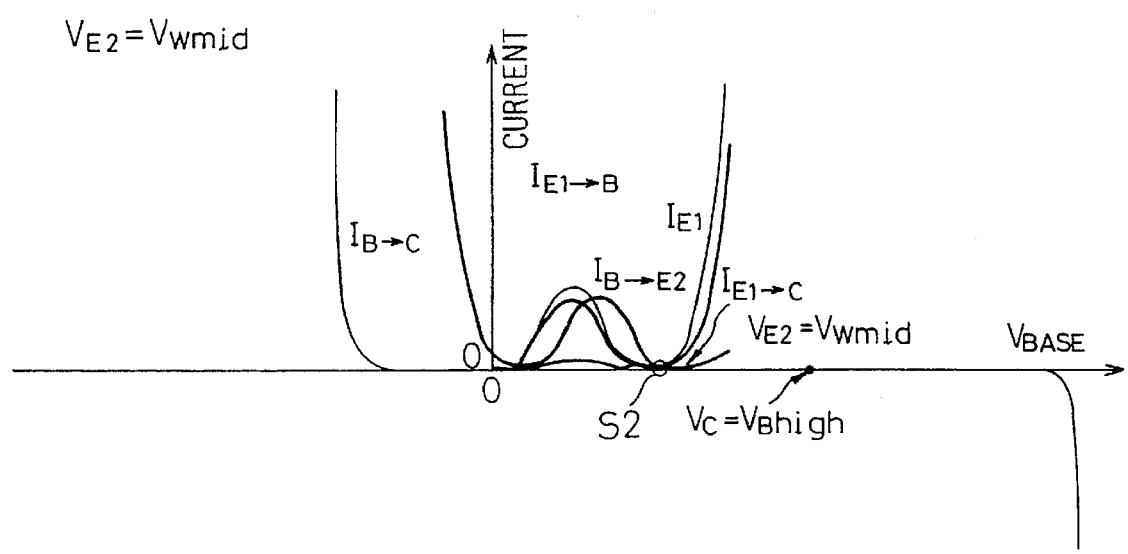

FIGS. 26A to 26C explain a write operation to the stable operation point S1 involving a low base potential of the memory cell mentioned above. FIG. 26A corresponds to FIG. 22B, and no figure corresponding to FIG. 22A is shown.

In FIG. 26A, the memory cell has data at one of the operation points S1 and S2. A high potential VC=VBhigh is applied to the collector through the bit line BL. The VBhigh is higher than a sustain potential. A potential VE2=VWlow, which is lower than a sustain potential VWmid, is applied to the second emitter E2 through the word line WL. In FIG. 26C, the sustain potential VE2=VWmid is applied to the second emitter E2 through the word line WL, to write data to the operation point S2. FIG. 26B shows a transition period in which the potential applied to the second emitter E2 through the word line WL is changed from the low potential VWlow to the sustain potential VWmid (VWlow<VE2<VWmid).

A rewrite operation of the memory cell to which data has been written according to any one of the embodiments of FIGS. 21A to 22G and 25A to 26C will be explained next.

FIGS. 27A and 27B explain the operations of memory cells whose data are not rewritten. FIGS. 28A and 28B explain the operations of memory cells whose data are rewritten. Each memory cell has first and second base-emitter junctions D1 and D2. The junctions D1 and D2 and a base layer form series circuits that provide two stable operation points S1 and S2. The memory cells of FIGS. 27A and 28A will store data at the operation point S2, and the memory cells of FIGS. 27B and 28B will store data at the operation point S1.

The memory cell of FIG. 27A has data at the operation point S2 involving a high base potential and is not rewritten. A voltage VBL=VC applied to the collector C through the bit line BL is changed from an intermediate voltage VBmid to a high voltage VBhigh at T0 to T3. A voltage VWL=VE2 applied to the second emitter E2 through the word line WL is changed from an intermediate voltage VWmid to a high voltage VWhigh at T1, to carry out a read operation, and at T4, from VWmid to a low voltage VWlow. Thereafter, the voltage VWL is changed to VWmid, to write the same data to the operation point S2.

The memory cell of FIG. 27B has data at the operation point S1 involving a low base potential and is not rewritten. The bit line voltage VBL is changed from VBmid to VBhigh at T0 to T3. The word line voltage VWL is changed from VWmid to VWhigh at T1 to carry out a read operation, and at T4, from VWmid to VWlow. Thereafter, the voltage VWL is changed to VWmid, to VWhigh at T6, and to VWmid to write the same data to the operation point S1.

As is apparent in FIGS. 27A and 27B, a large current IBL flows through the bit line BL at T1 when data is stored to the operation point S2. When data is stored to the operation point S1, no current IBL flows at T1, and an instantaneous current IBL flows at T5 through the bit line BL.

The memory cell of FIG. 28A has data at the operation point S1 and is rewritten. The word line voltage VWL=VE2 applied to the second emitter E2 through the word line WL is changed from VWmid to VWhigh at T1 to carry out a read operation. The word line voltage VWL is changed from VWmid to VWlow at T4 and again to VWmid to write data to the other operation point S2.

The memory cell of FIG. 28B has data at the operation point S2 and is rewritten. The word line voltage VWL is changed from VWmid to VWhigh at T1, from VWmid to VWlow at T4, from VWmid to VWhigh at T6, and again to VWmid. The bit line voltage VBL is changed from VBmid to VBhigh at T6 and again to VBmid to write data to the other operation point S1. As is apparent in FIGS. 28A and 28B, an instantaneous current IBL flows through the bit line BL at T5 when data is stored to the operation point S1.

If the number of memory cells connected to a given word line is smaller than the number of bits to which given data is written in the embodiments of FIGS. 27A to 28B, data stored in memory cells to which no data is written is read once at T1, and the read data is written to the memory cells at write timing.

As shown in FIGS. 27A and 28A, the potential VBL=VC applied to the collector C through the bit line BL is maintained, and the low potential VWlow=VE2 is applied to a given word line WL at T4 to destruct the two stable operation points S1 and S2 of every memory cell connected to the word line WL. Thereafter, the sustain potential VWmid is applied to the word line WL, to write data to the stable operation point S2 of the memory cells. In this way, the voltage applied to the collector of a memory cell to write data to the operation point S2 is set so that the base-collector junction does not influence the negative differential characteristic. Namely, the collector voltage is set to provide no gain and be below a reverse breakdown voltage. In practice, the collector voltage is set to be equal to a ground level. Since the two base-emitter junctions of the memory cell have N-shaped negative differential characteristics having different peak currents, the memory cell changes from a monostable state to the bistable state when a potential applied to a corresponding word line is decreased and then increased. At this time, the operation point of the transistor is uniquely set to S2 according to the mobile operation principle.

After data is written to the stable operation point S2 of the memory cells, data may be written to the operation point S1 of some of the memory cells. To achieve this, a low potential VBlow, which is lower than a sustain potential, is applied to bit lines BL connected to the memory cells to which data is written to the operation point S1 thereof. Namely, a voltage VC=VBlow is applied to the collectors of these memory cells at T6. A high potential VE2=VWhigh is applied to the second emitters E2 through the given word line WL, to destruct the two stable operation points at T6. Thereafter, the sustain potential VE2=VWmid is applied to the second emitters E2 through the word line at T7, to write data to the operation points S1. At this time, a current flows over the threshold of the reverse breakdown voltage of the base-collector junction, to invert the sizes of the peak currents of the N-shaped negative differential characteristics of the two base-emitter junctions. Accordingly, when the potential applied to the word line is decreased and then increased to change a monostable state to the bistable state, the operation point of the memory cell is uniquely set to S1 according to the mobile operation principle. In this way, the present invention determines data to be written to a memory cell according to a voltage applied to the collector of the memory cell. The present invention is capable of carrying out a write operation to a memory cell without regard to the forward characteristic of the memory cell that greatly affects the operation margins of peripheral circuits.

Figures 29A, 29B:
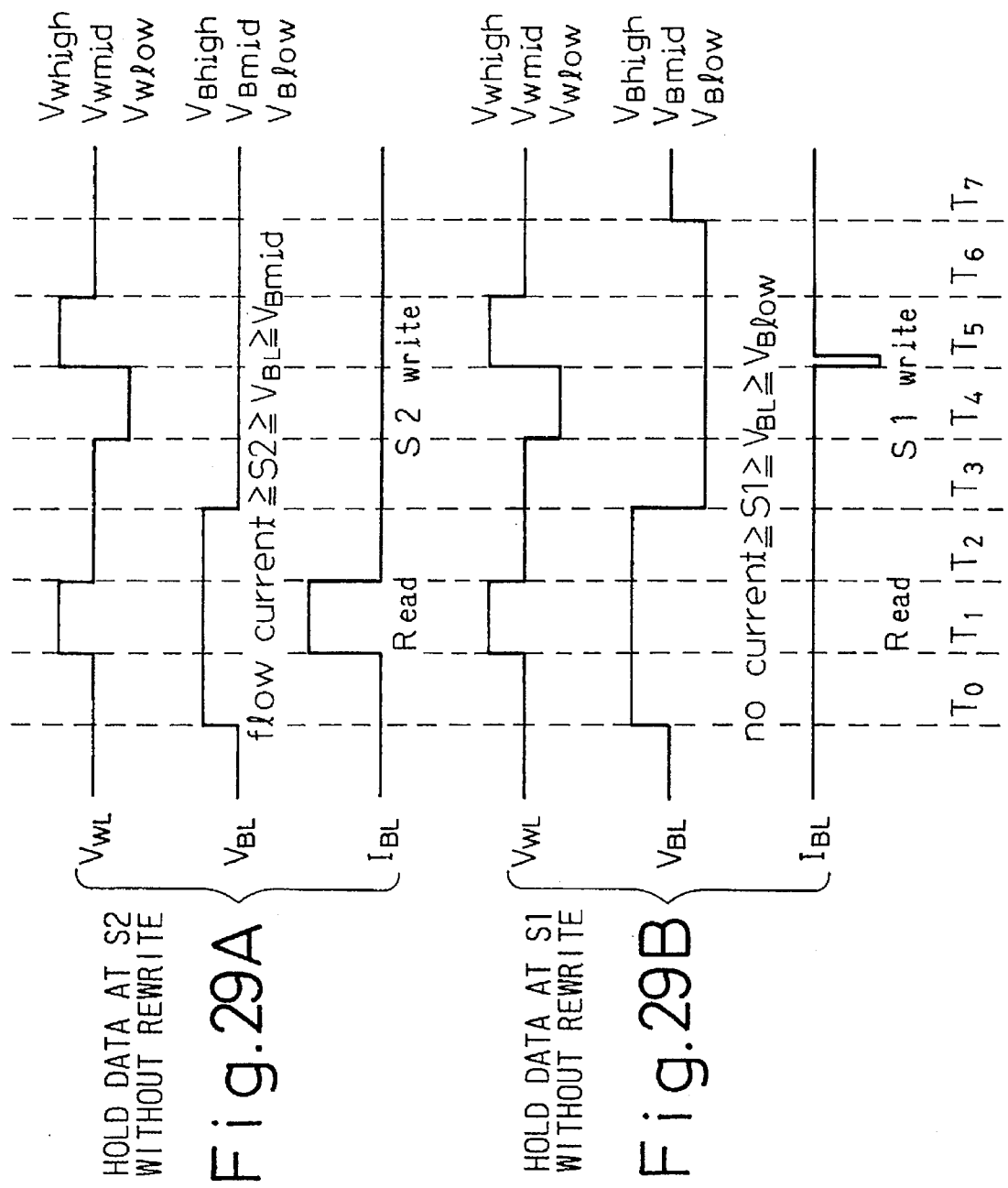
FIGS. 29A and 29B explain the operation of a memory cell of a semiconductor memory according to the present invention that is not rewritten.

FIGS. 29A and 29B explain the operations of memory cells whose data are not rewritten. FIGS. 30A and 30B explain the operations of memory cells whose data are rewritten. Each memory cell has first and second base-emitter junctions D1 and D2. The junctions D1 and D2 and a base layer form series circuits that provide two stable operation points S1 and S2. The memory cells of FIGS. 29A and 30A will store data at the operation point S2, and the memory cells of FIGS. 29B and 30B will store data at the operation point S1.

The memory cell of FIG. 29A has data at the operation point S2 and is not rewritten. A voltage VBL=VC applied to the collector C through the bit line BL is changed from an intermediate voltage VBmid to a high voltage VBhigh at T0 to T3. A voltage VWL=VE2 applied to the second emitter E2 through the word line WL is changed from an intermediate voltage VWmid to a high voltage VWhigh at T1, to carry out a read operation, and at T5, from VWmid to VWhigh. Thereafter, the voltage VWL is changed to VWmid, to write the same data to the operation point S2.

The memory cell of FIG. 29B has data at the operation point S1 and is not rewritten. The bit line voltage VBL is changed from VBmid to VBhigh at T0 to T3. The word line voltage VWL is changed from VWmid to VWhigh at T1 to carry out a read operation, and at T4, from VWmid to VWlow. Thereafter, the voltage VWL is changed to VWhigh at T5, and to VWmid to write the same data to the operation point S1.

As is apparent in FIGS. 29A and 29B, a large current IBL flows through the bit line BL at T1 when data is stored to the operation point S2. When data is stored to the operation point S1, no current IBL flows at T1, and an instantaneous current IBL flows at T5 through the bit line BL.

The memory cell of FIG. 30A has data at the operation point S1 and is rewritten. The word line voltage VWL=VE2 applied to the second emitter E2 through the word line WL is changed from VWmid to VWhigh at T1 to carry out a read operation. The word line voltage VWL is changed from VWmid to VWlow at T4, to VWhigh at T5, and again to VWmid to write data to the other operation point S2.

The memory cell of FIG. 30B has data at the operation point S2 and is rewritten. The word line voltage VWL is changed from VWmid to VWhigh at T1, from 10 VWmid to VWlow at T4, to VWhigh at T5, and again to VWmid. The bit line voltage VBL is changed from VBmid to VBlow at T3 to T6 and again to VBmid to write data to the other operation point S1. As is apparent in FIGS. 30A and 30B, an instantaneous current IBL flows through the bit line BL at T5 when data is stored to the operation point S1.

If the number of memory cells connected to a given word line is smaller than the number of bits to which given data is written in the embodiments of FIGS. 29A to 30B, data stored in memory cells to which no data is written is once read at T1, and the data is written to the memory cells at write timing.

In this way, the examples of FIGS. 29B and 30B write data to the first stable operation point S1 involving a low base potential. In this case, the potential VBlow, which is lower than the sustain potential, is applied to the bit line BL at T3 to T6. The examples of FIGS. 29A and 30A write data to the second stable operation point S2 involving a high base potential. In this case, the sustain potential VBmid is applied to the bit line BL at T3 to T6.

In this state, the low potential VWlow, which is sufficiently low to destruct the two stable operation points S1 and S2, is applied to the word line WL at T4 as shown in FIGS. 29A to 30B. Thereafter, the potential VWhigh, which is higher than the sustain potential, is applied to the word line WL at T5. Next, the sustain potential VWmid is again applied to the word line WL at T6 to write data at a required one of the operation points S1 and S2 of the memory cell.

As explained above, the potential VBL=VC applied to the collector C of the memory cell through the bit line BL is set to the sustain potential VBmid, to write data to the operation point S2. To write data to the operation point S1, the potential VBL=VC is set to the low potential VBlow, which is lower than the sustain potential. In this state, the potential VWL=VE2 applied to the second emitter through the word line WL is changed from VWlow, which is lower than the sustain potential, to VWhigh, which is higher than the sustain potential. Thereafter, the word line potential VWL is returned to the sustain potential VWmid. In this way, data is written to any one of the operation points S1 and S2 without providing a select signal.

As explained above, the present invention provides a semiconductor memory having memory cells each involving a small number of elements and a small area, as well as a method of sustaining, reading, and writing data at, from, and to the semiconductor memory.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor memory having a plurality of bit lines, a plurality of word lines, a plurality of ground lines and a plurality of memory cells, each of the bit lines intersecting each of the word and the ground lines, to form intersections where the memory cells are arranged, and each memory cell comprises:
a double-emitter resonance-tunnel-hot-electron transistor having a collector, a first emitter and a second emitter, each emitter-base junction of the transistor having an N-shaped negative differential current-voltage characteristic of a relatively small gain up to a peak current and a relatively large gain after a valley current, the transistor having a resonance tunnel barrier and a collector barrier so that most electrons injected from a first level are reflected by the collector barrier and produce no collector current, and electrons from a second level or electrons thermally excited pass over the collector barrier to produce a collector current; and
the first emitter being connected to the ground line, the second emitter being connected to the word line, and the collector being connected to the bit line.

2. A semiconductor memory as claimed in claim 1, wherein the negative differential characteristics of the transistor are designed such that a forward peak current of the first emitter is smaller than a reverse peak current of the second emitter.

3. A semiconductor memory as claimed in claim 2, wherein the area of the emitter-base junction of the first emitter is smaller than the area of the emitter-base junction of the second emitter.

4. A semiconductor memory as claimed in claim 2, wherein the negative differential characteristics are realized by thinning a layer of the resonance tunnel barrier beside the base of the transistor without changing the area thereof.

5. A semiconductor memory as claimed in claim 2, wherein the negative differential characteristics are realized by lowering a layer of the resonance tunnel barrier beside the base of the transistor without changing the area thereof.

6. A semiconductor memory as claimed in claim 2, wherein the negative differential characteristics are realized by thickening a spacer of the base beside the resonance tunnel barrier of the transistor without changing the area thereof.

7. A semiconductor memory as claimed in claim 1, wherein the negative differential characteristics of the transistor are designed such that a forward peak current is larger than a reverse peak current, and the reverse peak current is larger than the product of the forward peak current and a current gain at a resonance peak with given voltages being applied to the collector and the emitters.

8. A semiconductor memory as claimed in claim 7, wherein the area of the emitter-base junction of the first emitter is larger than the area of the emitter-base junction of the second emitter.

9. A semiconductor memory as claimed in claim 7, wherein the negative differential characteristics are realized by thickening a layer of the resonance tunnel barrier beside the base of the transistor without changing the area thereof.

10. A semiconductor memory as claimed in claim 7, wherein the negative differential characteristics are realized by heightening a layer of the resonance tunnel barrier beside the base of the transistor without changing the area thereof.

11. A semiconductor memory as claimed in claim 7, wherein the negative differential characteristics are realized by thinning a spacer of the base beside the resonance tunnel barrier of the transistor without changing the area thereof.

12. A semiconductor memory as claimed in claim 1, wherein the memory cell is arranged between the intersections of the bit line, the word line, and the ground line with the word line and the ground line being in parallel with each other and orthogonal to the bit line.

13. A semiconductor memory as claimed in claim 1, wherein the semiconductor memory has the bit lines, the word lines, the ground lines, and the memory cells, the bit lines intersecting the word lines and the ground lines, to form intersections where the memory cells are arranged, respectively, wherein the semiconductor memory further comprises:
a bit line address decoder for supplying an address signal to the bit lines;
a word line address decoder for supplying an address signal to the word lines; and
a sense circuit for detecting data stored in the memory cells through the bit lines.

14. A semiconductor memory as claimed in claim 13, wherein the word lines and the ground lines are alternated one by one.

15. A semiconductor memory as claimed in claim 13, wherein the word lines and the ground lines are alternated two by two.

16. A semiconductor memory as claimed in claim 15, wherein every two adjacent ground lines are integrated into one.

17. A method of sustaining data of a memory cell of a semiconductor memory, the semiconductor memory having a plurality of bit lines, a plurality of word lines, a plurality of ground lines and a plurality of memory cells, each of the bit lines intersecting each of the word and the ground lines, to form intersections where the memory cells are arranged, and each memory cell comprises:

a double-emitter resonance-tunnel-hot-electron transistor having a collector, a first emitter and a second emitter, each emitter-base junction of the transistor having an N-shaped negative differential current-voltage characteristic of a relatively small gain up to a peak current and a relatively large gain after a valley current, the transistor having a resonance tunnel barrier and a collector barrier so that most electrons injected from a first level are reflected by the collector barrier and produce no collector current, and electrons from a second level or electrons thermally excited pass over the collector barrier to produce a collector current; and the first emitter being connected to the ground line, the second emitter being connected to the word line and the collector being connected to the bit line, the first and second base-emitter junctions of the memory cell forming, with the base layer, corresponding series circuits providing two stable operation points, wherein the method comprises the steps of:

applying a potential, which biases the transistor to the valleys of the N-shaped negative differential characteristics, to one of the first and second emitters; and applying a potential to the bit line, the potential being sufficiently low, so as not to provide a gain with respect to a ground level, and being higher than a reverse breakdown voltage of the base-collector junction of the transistor.

18. A method as claimed in claim 17, wherein the potential applied to the bit line is at a ground level.

19. A method as claimed in claim 17, wherein the negative differential characteristics of the transistor are designed such that a forward peak current of the first emitter is smaller than a reverse peak current of the second emitter.

20. A method as claimed in claim 17, wherein the negative differential characteristics of the transistor are designed such that a forward peak current is larger than a reverse peak current, and the reverse peak current is larger than the product of the forward peak current and a current gain at a resonance peak with given voltages being applied to the collector and the emitters.

21. A method of reading data out of a memory cell of a semiconductor memory, the semiconductor memory having a plurality of bit lines, a plurality of word lines, a plurality of ground lines, and a plurality of memory cells, each of the bit lines intersecting each of the word and the ground lines, to form intersections where the memory cells are arranged, and each memory cell comprises:

a double-emitter resonance-tunnel-hot-electron transistor having a collector, a first emitter and a second emitter, each emitter base junction of the transistor having an N-shaped negative differential current-voltage characteristic of a relatively small gain up to a peak current and a relatively large gain after a valley current, the transistor having a resonance tunnel barrier and a collector barrier so that most electrons injected from a first level are reflected by the collector barrier and produce no collector current, and electrons from a second level or electrons thermally excited pass over the collector barrier to produce a collector current; and the first emitter being connected to the ground line, the second emitter being connected to the word line and the collector being connected to the bit line, the first and second base-emitter junctions of the memory cell forming, with the base layer, series circuits to provide the two stable operation points, wherein the method comprises the steps of:

applying a potential to the bit line so that the transistor of the memory cell provides a sufficient gain, and the first stable operation point involving a low base potential provides a low gain and the second stable operation point involving a high base potential provides a high gain; and applying a potential to the word line, the potential being higher than a sustain potential and sufficiently low so as not to destruct the data stored in the memory cell, and detecting a current passing through the bit line, to read the data.

22. A method as claimed in claim 21, wherein the negative differential characteristics of the transistor are designed such that a forward peak current of the first emitter is smaller than a reverse peak current of the second emitter.

23. A method as claimed in claim 21, wherein the negative differential characteristics of the transistor are designed such that a forward peak current is larger than a reverse peak current, and the reverse peak current is larger than the product of the forward peak current and a current gain at a resonance peak with given voltages being applied to the collector and the emitters.

24. A method of writing data to a memory cell of a semiconductor memory, the semiconductor memory having a plurality of bit lines, a plurality of word lines, a plurality of ground lines and a plurality of memory cells, each of the bit lines intersecting each of the word and the ground lines, to form intersections where the memory cells are arranged, and each memory cell comprises:

a double-emitter resonance-tunnel-hot-electron transistor having a collector, a first emitter, and a second emitter, each emitter-base junction of the transistor having an N-shaped negative differential current-voltage characteristic of a relatively small gain up to a peak current and a relatively large gain after a valley current, the transistor having a resonance tunnel barrier and a collector barrier so that most electrons injected from a first level are reflected by the collector barrier and produce no collector current, electrons from a second level or electrons thermally excited pass over the collector barrier to produce a collector current, and the negative differential characteristics of the transistor being designed such that a forward peak current of the first emitter is smaller than a reverse peak current of the second emitter; and the first emitter being connected to the ground line, the second emitter connected to the word line and the collector being connected to the bit line, the first and second base-emitter junctions of the memory cell forming, with the base layer, series circuits to provide the two stable operation points involving low and high base potentials, respectively, wherein the method comprises the steps of:

applying a potential, which is lower than a sustain potential, to the memory cell, applying a potential to the word line, to destruct the two stable operation points, and again applying the sustain potential to the word line, to thereby write data to the stable operation point of the memory cell when the data must be written to the operation point; and maintaining the sustain potential to the bit line of the memory cell, applying a potential to the word line, to destruct the two stable operation points, and again applying the sustain potential to the word line, to thereby write data to the second stable operation point of the memory cell when the data must be written to the operation point.

25. A method as claimed in claim 24, wherein the area of the emitter-base junction of the first emitter is smaller than the area of the emitter-base junction of the second emitter.

26. A method as claimed in claim 24, wherein the negative differential characteristics are realized by thinning a layer of the resonance tunnel barrier beside the base of the transistor without changing the area thereof.

27. A method as claimed in claim 24, wherein the negative differential characteristics are realized by lowering a layer of the resonance tunnel barrier beside the base of the transistor without changing the area thereof.

28. A method as claimed in claim 24, wherein the negative differential characteristics are realized by thickening a spacer of the base beside the resonance tunnel barrier of the transistor without changing the area thereof.

29. The method of writing data to an array of memory cells of a semiconductor memory, the semiconductor memory having a plurality of bit lines, a plurality of word lines, a plurality of ground lines and a plurality of memory cells, each of the bit lines intersecting each of the word and the grounds lines, to form intersections where the memory cells are arranged, and each memory cell comprises:

a double-emitter resonance-tunnel-hot-electron transistor having a collector, a first emitter, and a second emitter, each emitter-base junction of the transistor having an N-shaped negative differential current-voltage characteristic of a relatively small gain up to a peak current and a relatively large gain after a valley current, the transistor having a resonance tunnel barrier and a collector barrier so that most of the electrons injected from a first level are reflected by the collector barrier and produce no collector current, electrons from a second level or electrons thermally excited pass over the collector barrier to produce a collector current, and the negative differential characteristics of the transistor being designed such that a forward peak current of the first emitter is smaller than a reverse peak current of the second emitter; and the first emitter being connected to the ground line, the second emitter being connected to the word line, and the collector being connected to the bit line, the first and second base-emitter junctions of the memory cell forming, with the base layer, series circuits to provide the two stable operation points involving low and high base potentials, respectively, wherein the method comprises the steps of:

maintaining a sustain potential to the bit line, applying a potential to a given word line to destruct the two stable operation points of each memory cell connected to the word line, applying a sustain potential to the word line, to thereby write data to the stable operation point of each memory cell connected to the word line;

applying a potential, which is lower than the sustain potential, to be lines connected to memory cells to which data has been written at the second operation point and to which data must be written at the first operation point; and applying a potential to the given word line to destruct the two stable operation points and applying the sustain potential to the word line, to write the data to the memory cells.

30. A method as claimed in claim 29, wherein the area of the emitter-base junction of the first emitter is smaller than the area of the emitter-base junction of the second emitter.

31. A method as claimed in claim 29, wherein the negative differential characteristics are realized by thinning a layer of the resonance tunnel barrier beside the base of the transistor without changing the area thereof.

32. A method as claimed in claim 29, wherein the negative differential characteristics are realized by lowering a layer of the resonance tunnel barrier beside the base of the transistor without changing the area thereof.

33. A method as claimed in claim 29, wherein the negative differential characteristics are realized by thickening a spacer of the base beside the resonance tunnel barrier of the transistor without changing the area thereof.

34. A method as claimed in claim 29, wherein, when the number of memory cells connected to a given word line is smaller than the number of bits to which data is written, data stored in memory cells to which no data is written is once read, and the read data is again written to the memory cells at write timing.

35. A method of writing data to a memory cell of a semiconductor memory, the semiconductor memory having a plurality of bit lines, a plurality of word lines, a plurality of ground lines and a plurality of memory cells, each of the bit lines intersecting each of the word and the ground lines, to form intersections where the memory cells are arranged, and each memory cell comprises:

a double-emitter resonance-tunnel-hot-electron transistor having a collector, a first emitter, and a second emitter, each emitter-base junction of the transistor having an N-shaped negative differential current-voltage characteristic of a relatively small gain up to a peak current and a relatively large gain after a valley current, the transistor having a resonance tunnel barrier and a collector barrier so that most of electrons injected from a first level are reflected by the collector barrier and produce no collector current, electrons from a second level or electrons thermally excited pass over the collector barrier to produce a collector current, and the negative differential characteristics of the transistor being designed such that a forward peak current of the first emitter is smaller than a reverse peak current of the second emitter; and the first emitter being connected to the ground line, the second emitter being connected to the word line and the collector being connected to the bit line, the first and second base-emitter junctions of the memory cell forming, with the base layer, series circuits to provide the two stable operation points involving low and high base potentials, respectively, wherein the method comprises the steps of:

applying a potential, which is lower than a sustain potential, to the bit line when writing data to the first stable operation point;

applying a sustain potential to the bit line when writing data to the second stable operation point; and applying a potential, which is sufficiently low to destruct the two stable operation points, to the word line, applying a potential, which is higher than the sustain potential, to the word line, and again supplying the sustain potential to the word line, to thereby write the data to the memory cell.

36. A method as claimed in claim 35, wherein the area of the emitter-base junction of the first emitter is smaller than the area of the emitter-base junction of the second emitter.

37. A method as claimed in claim 35, wherein the negative differential characteristics are realized by thinning a layer of the resonance tunnel barrier beside the base of the transistor without changing the area thereof.

38. A method as claimed in claim 35, wherein the negative differential characteristics are realized by lowering a layer of the resonance tunnel barrier beside the base of the transistor without changing the area thereof.

39. A method as claimed in claim 35, wherein the negative differential characteristics are realized by thickening a spacer of the base beside the resonance tunnel barrier of the transistor without changing the area thereof.

40. A method as claimed in claim 35, wherein, when the number of memory cells connected to a given word line is smaller than the number of bits to which data is written, data stored in memory cells to which no data is written is once read, and the read data is again written to the memory cells at write timing.

41. A method of writing data to a memory cell of a semiconductor memory, the semiconductor memory having a plurality of bit lines, a plurality of word lines, a plurality of ground lines and a plurality of memory cells, each of the bit lines intersecting each of the word and the ground lines, to form intersections where the memory cells are arranged, and a memory cell comprises:

a double-emitter resonance-tunnel-hot-electron transistor having a collector, a first emitter, and a second emitter, each emitter-base junction of the transistor having an N-shaped negative differential current-voltage characteristic of a relatively small gain up to a peak current and a relatively large gain after a valley current, the transistor having a resonance tunnel barrier and a collector barrier so that most electrons injected from a first level are reflected by the collector barrier and produce no collector current, and electrons from a second level or electrons thermally excited pass over the collector barrier to produce a collector current, the negative differential characteristics of the transistor being designed such that a forward peak current is larger than a reverse peak current, and the reverse peak current being larger than the product of the forward peak current and a current gain at a resonance peak with given voltages being applied to the collector and the emitters; and the first emitter being connected to the ground line, the second emitter being connected to the word line and the collector being connected to the bit line, the first and second base-emitter junctions of the memory cell forming, with the base layer, series circuits to provide the two stable operation points involving low and high base potentials, respectively, wherein the method comprises the steps of:

applying a sustain potential to the bit line when writing data to the first stable operation point;

applying a potential, which is higher than the sustain potential, to the bit line when writing data to the second stable operation point; and applying a potential, which is sufficiently low to destruct the two stable operation points, to the word line, applying a potential, which is higher than the sustain potential, to the word line, and applying the sustain potential to the word line, to thereby write the data to the memory cell.

42. A method as claimed in claim 41, wherein the area of the emitter-base junction of the first emitter is larger than the area of the emitter-base junction of the second emitter.

43. A method as claimed in claim 41, wherein the negative differential characteristics are realized by thickening a layer of the resonance tunnel barrier beside the base of the transistor without changing the area thereof.

44. A method as claimed in claim 41, wherein the negative differential characteristics are realized by heightening a layer of the resonance tunnel barrier beside the base of the transistor without changing the area thereof.

45. A method as claimed in claim 41, wherein the negative differential characteristics are realized by thinning a spacer of the base beside the resonance tunnel barrier of the transistor without changing the area thereof.

46. A method as claimed in claim 41, wherein, when the number of memory cells connected to a given word line is smaller than the number of bits to which data is written, data stored in memory cells to which no data is written is once read, and the read data is again written to the memory cells at write timing.

* * * * *